(12) United States Patent
Bendat et al.

(10) Patent No.: US 6,474,710 B2
(45) Date of Patent: Nov. 5, 2002

(54) MOUNTING APPARATUS FOR ELECTRONIC PARTS

(75) Inventors: Zvi Bendat, New York, NY (US); Miroslaw Sokol, Rahway, NJ (US)

(73) Assignee: Lilogix, Inc., Piscataway, NJ (US)

( * ) Notice: Subject to any disclaimer, the term of this patent is extended or adjusted under 35 U.S.C. 154(b) by 0 days.

(21) Appl. No.: 10/044,189

(22) Filed: Jan. 11, 2002

(65) Prior Publication Data

US 2002/0060464 A1 May 23, 2002

Related U.S. Application Data

(63) Continuation of application No. PCT/US00/15539, filed on Jun. 5, 2000, which is a continuation-in-part of application No. 09/351,946, filed on Jul. 12, 1999, now Pat. No. 6,203,082.

(51) Int. Cl.[7] .............................. B25J 15/06; B25J 19/04
(52) U.S. Cl. ......................... 294/64.1; 29/743; 29/721; 901/40; 901/47
(58) Field of Search ............................... 294/64.1, 66.2, 294/907; 29/720, 721, 740, 743; 269/21; 279/3; 414/737, 752; 901/40, 47

(56) References Cited

U.S. PATENT DOCUMENTS

| | | | |
|---|---|---|---|
| 3,467,430 A | 9/1969 | Lowe | |
| 4,318,222 A | 3/1982 | Fröhlich | |
| 4,404,741 A | 9/1983 | Lebet et al. | |
| 4,867,569 A | 9/1989 | Mohara | |
| 4,887,351 A | 12/1989 | Porterfield et al. | |
| 4,951,383 A | 8/1990 | Amao et al. | |
| 5,018,936 A | 5/1991 | Izumi et al. | |
| 5,033,783 A | 7/1991 | Izumi et al. | |
| 5,093,983 A | 3/1992 | Sooy | |
| RE33,974 E | 6/1992 | Asai et al. | |
| 5,172,468 A | 12/1992 | Tanaka et al. | |
| 5,201,696 A | 4/1993 | Kinback et al. | |
| 5,222,293 A | 6/1993 | Ozimek et al. | |
| 5,251,266 A | 10/1993 | Spigarelli et al. | |
| 5,341,563 A | 8/1994 | Kamakura et al. | |
| 5,471,742 A | 12/1995 | Darr | |
| 5,590,456 A | 1/1997 | Armington et al. | |
| 6,203,082 B1 | 3/2001 | Bendat et al. | |

Primary Examiner—Johnny D. Cherry
(74) Attorney, Agent, or Firm—Selitto, Behr & Kim

(57) ABSTRACT

Mounting apparatus for electronic parts includes a mounting head and a suction-operated gripping mechanism for selectively gripping an object positioned adjacent one side of the gripping mechanism. A suction-operated attaching mechanism is also provided for selectively and removably attaching the gripping mechanism to the mounting head, whereby the gripping mechanism is removable from the mounting head and is hence replaceable. The mounting apparatus also has a viewing mechanism, including a camera, for viewing an object gripped by the gripping mechanism. The viewing mechanism is located on an opposite side of the gripping mechanism. The gripping mechanism has a light-transmitting portion positioned in such a manner that an object gripped by the gripping mechanism can be viewed by the camera through the gripping mechanism.

11 Claims, 18 Drawing Sheets

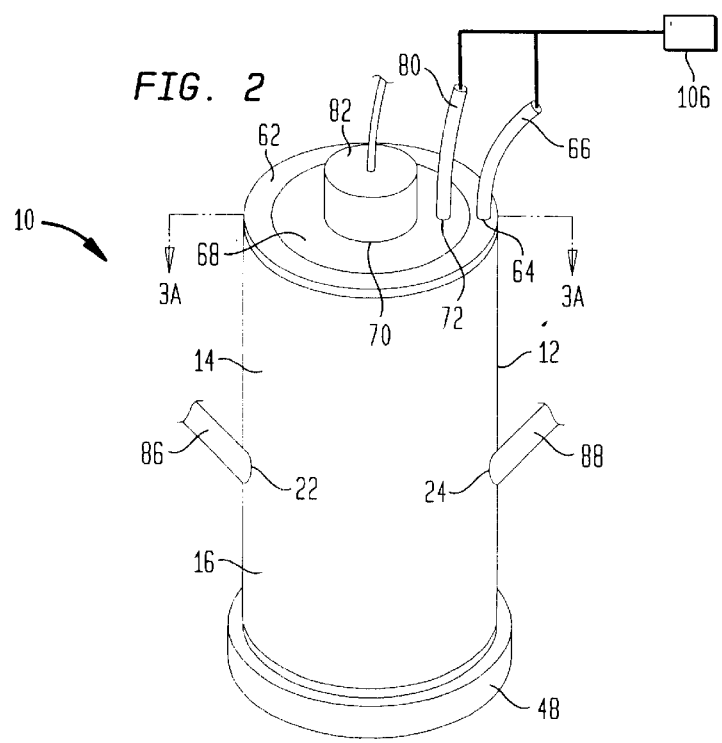
FIG. 2
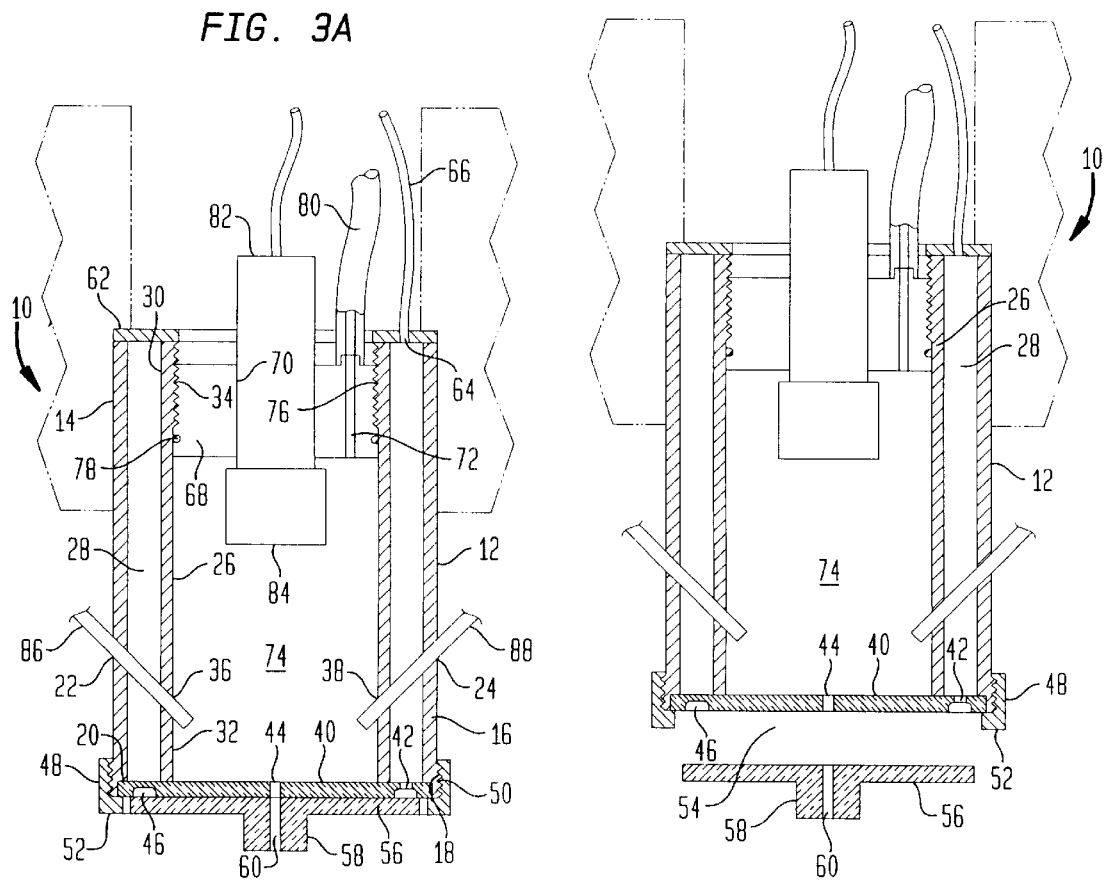
FIG. 3A
FIG. 3B

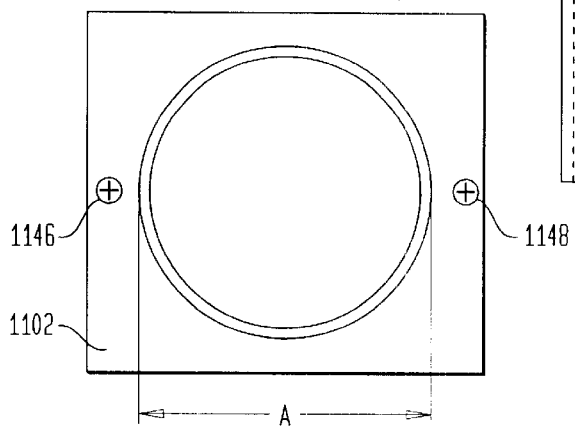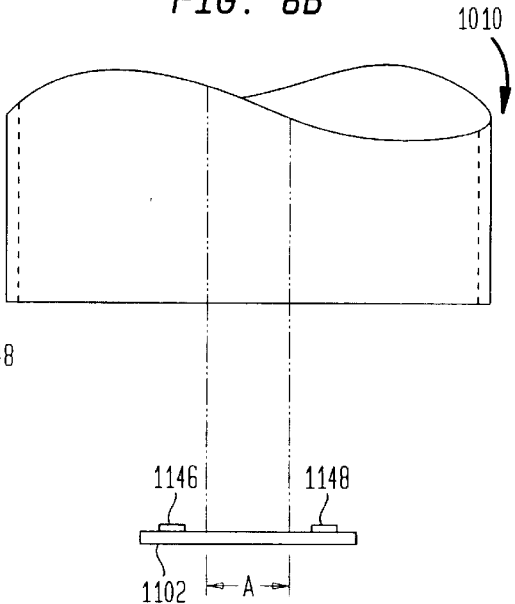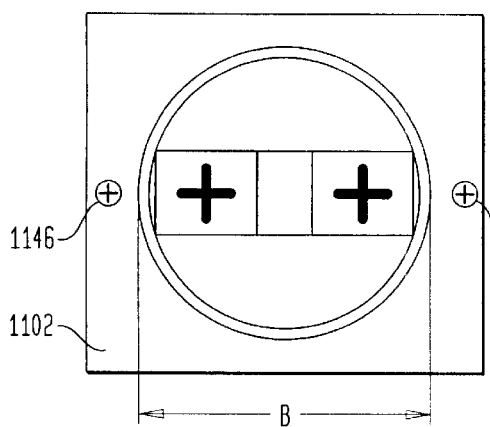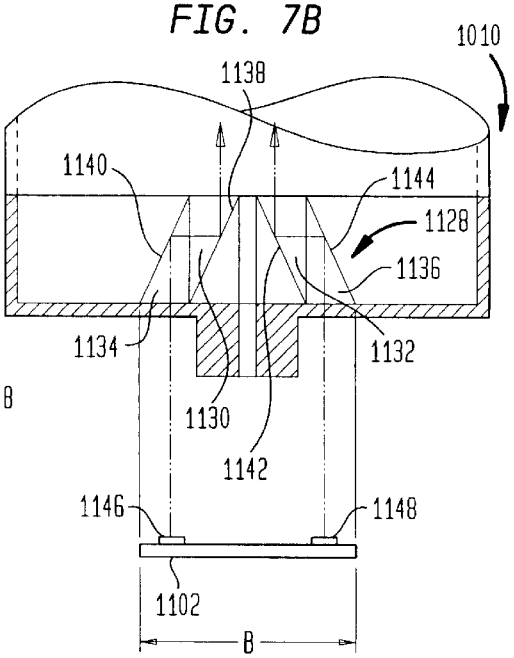

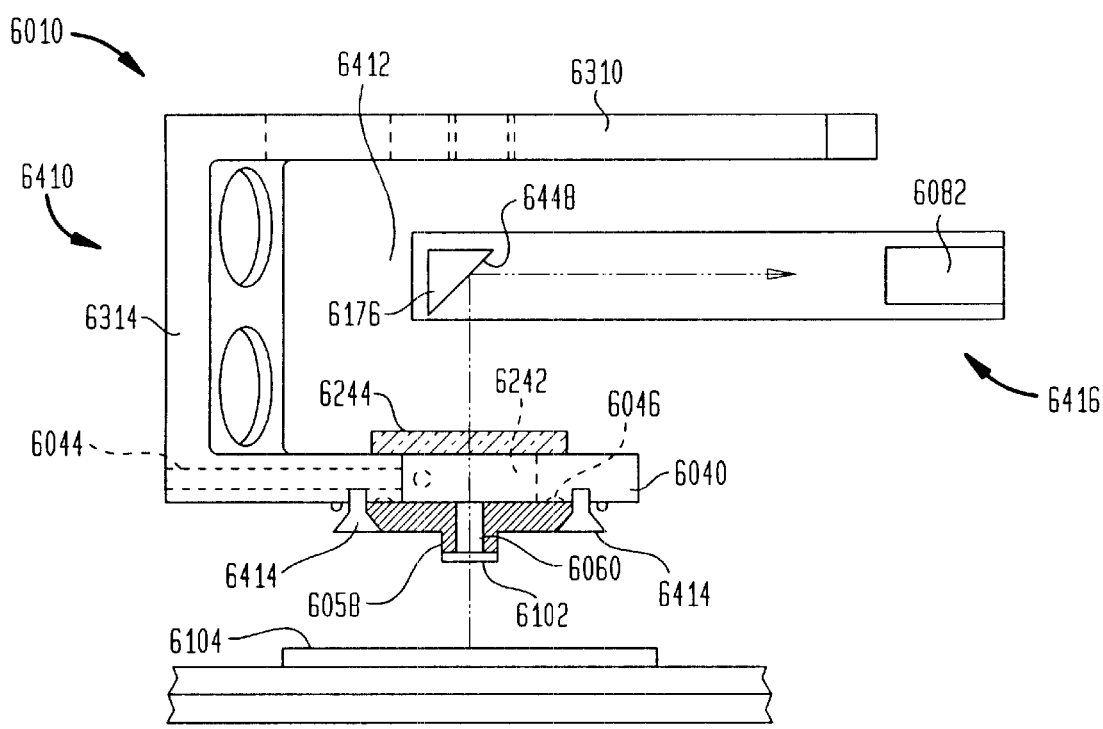

MOUNTING APPARATUS FOR ELECTRONIC PARTS

CROSS-REFERENCE TO RELATED APPLICATIONS

This is a continuation of International Patent Application No. PCT/US00/15539, filed Jun. 5, 2000 and published in English under PCT Article 21(2), which is a continuation-in-part of U.S. patent application Ser. No. 09/351,946, filed Jul. 12, 1999, now U.S. Pat. No. 6,203,082 B1 issued Mar. 20, 2001. The disclosures of International Patent Application No. PCT/US00/15539 and U.S. Pat. No. 6,203,082 are incorporated herein by reference.

FIELD OF THE INVENTION

The present invention relates to mounting apparatus for semiconductor components and, more particularly, to mounting apparatus for mounting semiconductor components on substrates.

BACKGROUND OF THE INVENTION

In the past, various devices have been developed for mounting electronic components to substrates. For instance, U.S. Pat. Nos. 5,018,936 and 5,033,783 disclose one type of mounting apparatus equipped with a mounting head, which is provided with a suction nozzle assembly at one end thereof, and a recognition camera, which is mounted above the mounting head opposite the suction nozzle assembly. The suction nozzle assembly is adapted to pick up electronic parts and is made from a light transmitting material such that the picked-up parts can be viewed by the camera through the suction nozzle assembly for determining their shape and position. In this manner, the mounting apparatus eliminates the need to provide a camera adapted to be positioned below the suction nozzle assembly for viewing the images of the picked-up parts.

While the mounting apparatus described above facilitates an electronic part mounting process, it has various shortcomings and disadvantages. For instance, it is believed that the mounting apparatus is not adapted for precise placement of microscopic objects, such as semiconductor components, on other objects (e.g., such as substrates) Moreover, because the camera is not incorporated into the mounting head, the camera needs to be mounted to the mounting apparatus separately from the mounting head, thereby requiring an additional effort to mount the camera to the mounting apparatus and then to align the camera with the mounting head. In addition, because the camera and the mounting head are independent and discrete from one another, an additional mechanism (e.g., a mounting bracket) needs to be provided for moving the camera conjointly with the mounting head. Further, because the suction nozzle assembly is mounted to the mounting head via a retainer member, detachment of the suction nozzle assembly from the mounting head involves an additional step (i.e., removal of the retainer member from the suction nozzle assembly).

SUMMARY OF THE INVENTION

The present invention overcomes the disadvantages and shortcomings of the prior art discussed above by providing a new and improved mounting apparatus for semiconductor components. More particularly, the mounting apparatus includes a mounting head and a suction-operated gripping mechanism for selectively gripping an object (e.g., a semiconductor component or die) positioned adjacent one side of the gripping mechanism. A suction-operated attaching mechanism is also provided for selectively and removably attaching the gripping mechanism to the mounting head, whereby the gripping mechanism is removable from the mounting head and is hence replaceable. The mounting apparatus also has a viewing mechanism, including a camera, for viewing an object gripped by the gripping mechanism. The viewing mechanism is located on an opposite side of the gripping mechanism. The gripping mechanism has a light-transmitting portion positioned in such a manner that an object gripped by the gripping mechanism can be viewed by the camera through the gripping mechanism.

The mounting apparatus constructed in accordance with the present invention is adapted for picking up and precisely placing microscopic devices, such as semiconductor devices and optoelectronic dies, to other semiconductor devices (e.g., substrates). The mounting apparatus is also adapted for picking up and precisely placing large objects with the same mounting apparatus.

The mounting apparatus is also adapted for high accuracy placement of semiconductor components or dies on substrates. For instance, high accuracy die placement is achieved by providing the mounting apparatus with moving and/or adjusting mechanisms adapted for accurate alignment of a semiconductor component relative to a substrate in all directions (i.e., X, Y, Z and $\theta$ directions). In this regard, the moving and adjusting mechanisms include an X-Y stage adapted to support thereon a substrate and adapted to move relative to the mounting head in the X and Y directions, thereby eliminating the need to move the mounting head in the X and Y directions after picking up a semiconductor component and hence minimizing inadvertent movement of the semiconductor component.

The viewing mechanism also facilitates high accuracy die placement. More particularly, the viewing mechanism is adapted for simultaneously or sequentially viewing (i.e., identifying) fiducial marks or other repeatable patterns on semiconductor components and on substrates. Fiducial marks can be viewed or identified by the camera with a single field of view or multiple fields of view. For instance, highly accurate die placement requires a high powered magnification for the camera, causing the field of view of the camera to decrease. An adjustment mechanism is provided for the viewing mechanism for adjusting the position of the camera in the X, Y and Z directions. In this manner, when one or more fiducial marks lies outside of the field of view of the camera, the position of the camera can be adjusted during die placement to bring such fiducial marks into the field of view of the camera. The mounting head can also include a rotatable mechanism for adjusting, if necessary, the angular orientation of a semiconductor component relative to the camera.

In accordance with one feature of the present invention, the mounting apparatus is provided with a force/load gauge for measuring the force being applied to the mounting head by an associated chuck during a die placement process and for providing a feedback to an operator or a controller. The force/load gauge is mounted within the mounting head.

Another feature of the present invention involves providing the mounting apparatus with a lighting mechanism. For instance, the mounting apparatus can be equipped with dark field and/or bright field illumination mechanisms. Fiber optic lights can also be used in combination with the mounting apparatus.

The mounting apparatus of the present invention is adapted for numerous applications. For instance, the mounting apparatus can be adapted for hand-held application (i.e., the mounting apparatus can be designed to be hand-held). The mounting apparatus can also be adapted for fully or partially automated die placement.

BRIEF DESCRIPTION OF THE DRAWINGS

For a more complete understanding of the present invention, reference is made to the following detailed description of exemplary embodiments considered in conjunction with the accompanying drawings, in which:

FIG. 2 is a perspective view of the pick-up device shown in FIG. 1;

FIG. 3A is a cross-sectional view, taken along section line 3A—3A and looking in the direction of the arrows, of the pick-up device shown in FIG. 2;

FIG. 3B is a view similar to FIG. 3A, except that an end plate of the pick-up device is shown in detached fashion;

FIGS. 6A and 6B are schematic views of a pick-up device similar to the pick-up device shown in FIG. 5, except that the pick-up device illustrated in FIGS. 6A and 6B is not equipped with a prism system;

FIGS. 7A and 7B are schematic views of the pick-up device shown in FIG. 5, illustrating the field of view associated with a camera of the pick-up device;

FIG. 26 is a schematic view of the device shown in FIG. 23 during a mounting process.

DETAILED DESCRIPTION OF THE EXEMPLARY EMBODIMENTS

Figure 1:
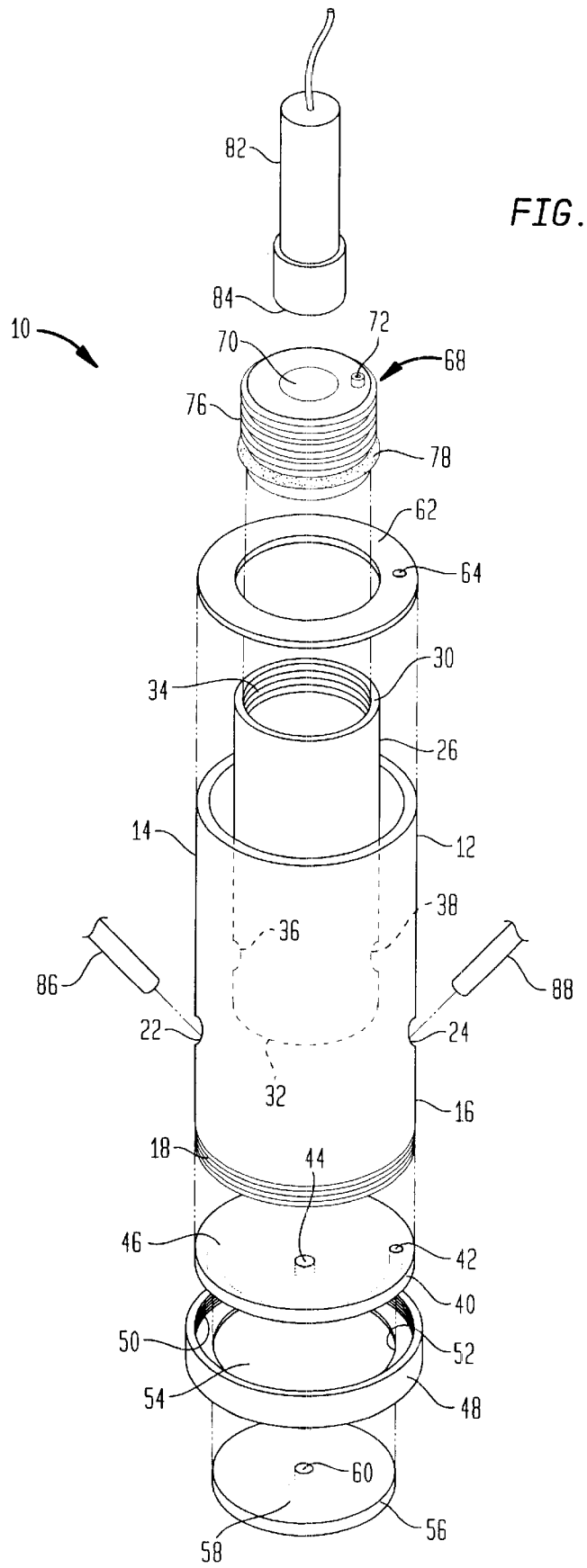
FIG. 1 is an exploded perspective view of a pick-up device constructed in accordance with a first embodiment of the present invention.

FIG. 1 illustrates a pick-up device 10 constructed in accordance with a first embodiment of the present invention. More particularly, the device 10 has a cylindrical housing (i.e., a mounting head) 12 having an upper open end 14 and a lower open end 16. The lower end 16 of the housing 12 includes an externally threaded portion 18 and an internal collar 20. The housing 12 also has a pair of openings 22, 24 formed therein between the upper and lower ends 14, 16. A cylinder 26 is mounted in the housing 12 for forming an annular suction chamber 28 (see FIGS. 3A and 3B) between the housing 12 and the cylinder 26 for purposes to be discussed hereinafter. The cylinder 26, which is substantially concentric with the housing 12, has an open top end 30 and an open bottom end 32, as well as an internally threaded portion 34 adjacent the top end 30. Openings 36, 38 are formed in the cylinder 26 between the top and bottom ends 30, 32.

Referring to FIGS. 1, 3A and 3B, the device 10 also has a disc 40 mounted in the lower end 16 of the housing 12. More particularly, the disc 40 engages the collar 20 and the bottom end 32 of the cylinder 26 in a fluid-tight manner so as to cooperate with the housing 12 and the cylinder 26 in forming the suction chamber 28. In this regard, sealing members (not shown) can be provided between the collar 20 and the disc 40 and between the cylinder 26 and the disc 40. The disc 40 has a pair of holes 42, 44 extending completely through the disc 40. The hole 42 is located towards the periphery of the disc 40 so as to be aligned with the suction chamber 28, while the hole 44 is located substantially at the center of the disc 40 and is thus substantially coaxial with the cylinder 26 and the housing 12. The disc 40 also has an annular groove 46 formed in a lower surface thereof opposite the cylinder 26 and communicating with the hole 42. The disc 40 is made from a transparent (i.e., light-transmitting) material, such as transparent plastic, glass, etc., for purposes to be discussed hereinafter.

With reference to FIGS. 1–3B, a retainer 48 is removably attached to the lower end 16 of the housing 12 for retaining the disc 40 in the lower end 16. More particularly, the retainer 48 has an internally threaded portion 50 for threadedly engaging the threaded portion 18 of the housing 12 and a flange 52 for capturing the disc 40 between the retainer 48 and the housing 12. That is, the retainer 48 maintains the disc 40 urged against the collar 20 and the bottom end 32 of the cylinder 26. The retainer 48 has a space 54 (see FIGS. 1 and 3B) defined by the flange 52.

Referring back to FIGS. 1, 3A and 3B, an end plate (i.e., an upper chuck) 56 is removably mounted in the space 54 by suction applied from the suction chamber 28 through the hole 42 of the disc 40 as will be discussed in greater detail hereinafter. The end plate 56 has a downwardly projecting suction nozzle 58 which is sized and shaped so as to engage and pick up objects, such as semiconductor components, located on one side of the end plate 56. A channel 60 extends completely through the nozzle 58 and is located substantially at the center of the end plate 56 such that when the end plate 56 is mounted in the space 54, the channel 60 is aligned with the hole 44. The end plate 56, including the nozzle 58, is made from a transparent material, such as plastic, for purposes to be discussed hereinafter.

With reference to FIGS. 1, 2 and 3A, the device 10 has an annular cap 62 mounted to the upper end 14 of the housing 12 and to the top end 30 of the cylinder 26. More particularly, the cap 62 closes off the suction chamber 28 in a fluid-tight manner and has a suction orifice 64 therethrough. A tube 66 is connected to the orifice 64 for applying suction to the suction chamber 28. A bushing 68, which has a mounting hole 70 and a suction orifice 72 therethrough, is mounted in the cylinder 26 adjacent to the top end 30 for forming a suction chamber 74 in the cylinder 26 between the bushing 68 and the disc 40. More particularly, the bushing 68 has an externally threaded portion 76 for threadedly engaging the internal treaded portion 34 of the cylinder 26. An O-ring 78 is positioned between the bushing 68 and the cylinder 26 for providing a fluid-tight seal therebetween. A suction tube 80 is connected to the orifice 80 for applying suction to the suction chamber 74. A camera 82, which is located on an opposite side of the end plate 56, is mounted to the bushing 68 through the mounting hole 70. In this regard, a sealing member (not shown) can be provided between the camera 82 and the bushing 68. The camera 82 has a lens 84 which is directed downwardly for viewing an object picked up by the nozzle 58.

Still referring to FIGS. 1, 2 and 3A, the device 10 has fiber optic lighting cables 86, 88 extending into the suction chamber 74. More particularly, the cable 86 extends through the opening 22 of the housing 12 and the opening 36 of the cylinder 26, while the cable 88 extends through the opening 24 of the housing 12 and the opening 38 of the cylinder 26. The cables 86, 88 are connected to a light source (not shown) and are oriented so as to illuminate the area around the nozzle 58, including an object picked up by the nozzle 58.

Figure 4:
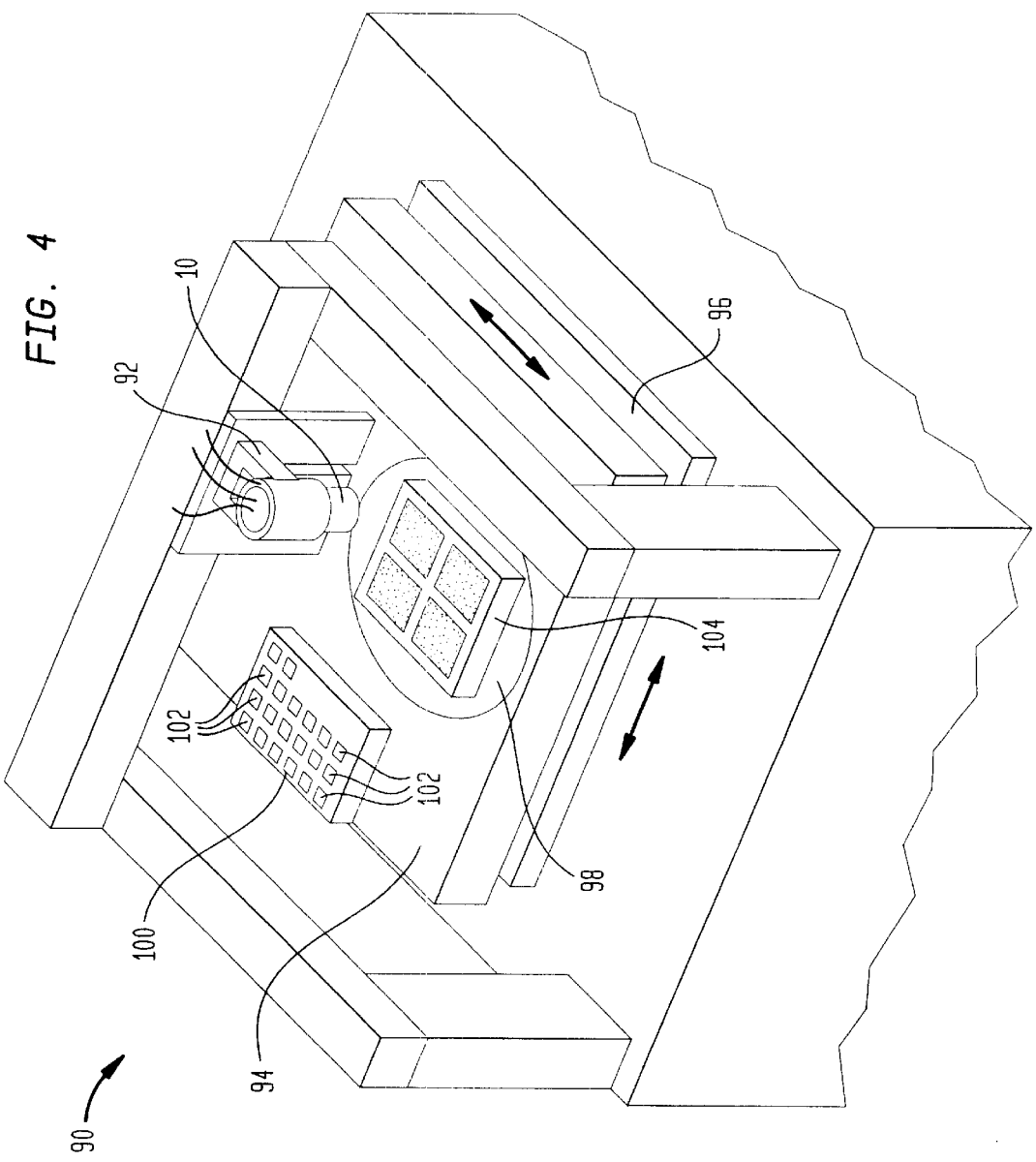
FIG. 4 is a perspective view of an automated mounting machine equipped with the pick-up device shown in FIGS. 1–3B.

With reference to FIG. 4, the device 10 is removably positioned on mounting apparatus 90 for mounting semiconductor components or dies to substrates. More particularly, the mounting apparatus 90 has a Z-axis moving mechanism 92 for mounting the device 10 to the mounting apparatus 90 such that the device 10 is movable in a direction substantially parallel to the Z-axis of the mounting apparatus 90. The mounting apparatus 90 also has a conventional X-axis moving table 94, a conventional Y-axis moving table 96 and a rotary table 98. A waffle pack 100 containing a plurality of semiconductor components 102 is positioned on the X-axis moving table 94 adjacent to the rotary table 98. A substrate 104 is placed on the rotary table 98 for receiving the semiconductor components 102 thereon. The mounting apparatus 90 also has a controller (not shown) for controlling the operation of the mounting apparatus 90 and a viewing screen (not shown) for viewing an image of a semiconductor component fed thereto from the camera 82.

In operation, the suction tubes 66, 80 are connected to a suction source or sources 106 (see FIG. 2) such that suction is created in the suction chambers 28, 74. The end plate 56 is then mounted to the device 10. More particularly, the end plate 56 is held in proper position by suction applied thereto from the suction chamber 28 through the hole 42 (see FIG. 3A). Because the annular groove 46 communicates with the suction chamber 28 through the hole 42, suction is applied to the end plate 58 in annular fashion (i.e., an increased suction area is provided for gripping the end plate 58). The X-axis and Y-axis moving tables 94, 96 move so as to properly position the waffle pack 100 below the device 10. The device 10 is moved downwardly by the Z-axis moving mechanism 92, picks up a semiconductor component 102 from the waffle pack 100 and is then moved upwardly by the Z-axis moving mechanism 92. More particularly, the semiconductor component 102 is picked up by suction applied thereto from the suction chamber 74 through the hole 44 of the disc 40 and the channel 62 of the nozzle 58. Because the end plate 56 and the disc 40 are transparent, the camera 82 is able to view the semiconductor component 102 gripped by the nozzle 58 through the disc 40 and the end plate 56. As a result, the camera 82 transmits the image of the semiconductor component 102 to the controller and/or the viewing screen for determining the orientation and/or condition of the semiconductor component 102. After the X-axis and Y-axis moving tables 94, 96 and the rotatable table 98 place the substrate 104 below the device 10 at a proper orientation relative to the semiconductor component 102, the device 10 is moved downwardly by the Z-axis mechanism 92 and releases the semiconductor component 102 at a proper location on the substrate 104.

It should be appreciated that the present invention provides numerous advantages over the prior art discussed above. For instance, because the camera 82 is housed in the housing 12 and is therefore a component of the device 10, it moves conjointly with the device 10. The camera 82 can also be mounted to or dismounted from the mounting apparatus 90 conjointly with the device 10, thereby eliminating the need to separately mount the camera 82 to the mounting apparatus 90 or to dismount same from the mounting apparatus 90. In addition, because the camera's position is substantially fixed relative to the nozzle 58, it is not necessary to re-align the camera 82 with the nozzle 58 after mounting the device 10 to the mounting apparatus 90.

It should be noted that the present invention can have numerous modifications and variations. For instance, the fiber optic lighting cables 86, 88 can be replaced with other lighting mechanisms. Specifically, the device 10 can be equipped with a dark field light system and/or a bright field light system. Moreover, while the mounting apparatus 90 is shown to have only one camera (i.e., the camera 82), additional cameras can be provided for viewing the substrate 104, the semiconductor components 102 and/or fiducial marks associated therewith.

It should also be noted that the present invention can have numerous applications. For instance, the device 10 can be adapted for hand-held use. More particularly, the device 10 can be held by a user's hand and be used for transporting small objects, including semiconductor components, to desired locations. In this application, the device 10 can be provided with a hand grip (as indicated by the broken line representation in FIGS. 3A and 3B). Moreover, although the device 10 is specifically adapted for use in connection with semiconductor components, it can be used for picking up and/or mounting any electronic components.

FIGS. 5, 7A and 7B, FIG. 8, FIG. 9, FIGS. 10–20B, FIGS. 21 and 22 and FIGS. 23–26 depict second, third, fourth, fifth, sixth and seventh embodiments, respectively, of the present invention. Elements illustrated in FIGS. 5, 7A and 7B, FIG. 8, FIG. 9, FIGS. 10–20B, FIGS. 21 and 22 and FIGS. 23–26, which correspond, either identically or substantially, to the elements described above with respect to the embodiment of FIGS. 1–4 have been designated by corresponding reference numerals increased by one thousand, two thousand, three thousand, four thousand, five thousand and six thousand respectively. Unless otherwise stated, the embodiments of FIGS. 5, 7A and 7B, FIG. 8, FIG. 9, FIGS. 10–20B, FIGS. 21 and 22 and FIGS. 23–26 are constructed and assembled in the same basic manner as the embodiment of FIGS. 1–4.

Figure 5:
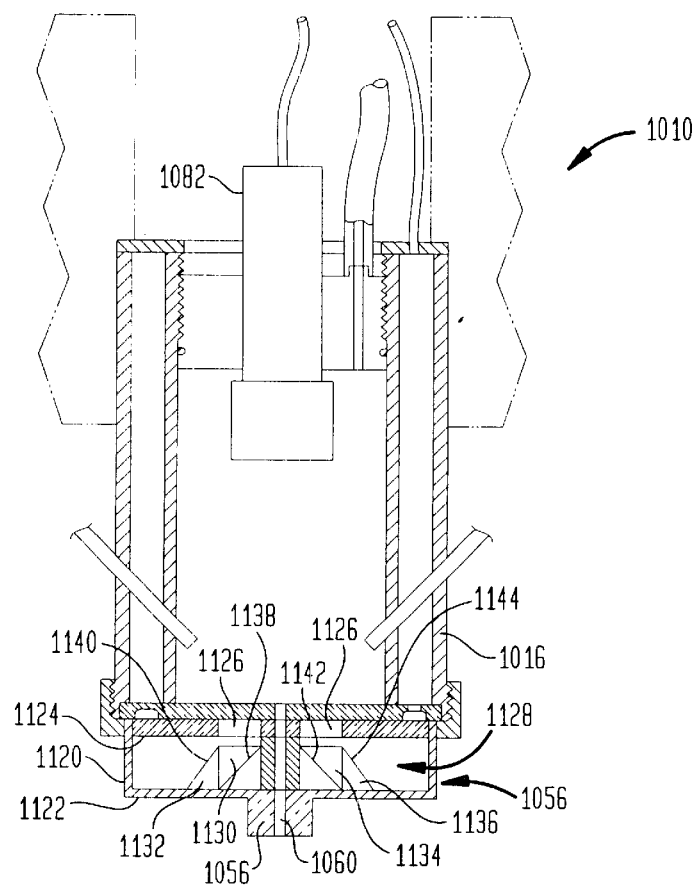
FIG. 5 is a cross-sectional view of a pick-up device constructed in accordance with a second embodiment of the present invention, the device having a prism system.

FIG. 5 shows a pick-up device 1010 constructed in accordance with a second embodiment of the present invention. The device 1010 has an end plate assembly 1056 removably attached to a lower end 1016 of the device 1010. Except for the end plate assembly 1056, the device 1010 is substantially identical to the device 10 of the embedment of FIGS. 1–4 in construction and operation. The construction and operation of the end plate assembly 1056 will be described hereinafter.

Referring to FIG. 5, the end plate assembly 1056 is equipped with a cylindrical casing 1120 having a bottom plate 1122 and a top plate 1124. The bottom plate 1122 has a construction similar to that of the end plate 56 of the embodiment of FIGS. 1–4 and therefore has a suction nozzle 1056 sized and shaped so as to engage an object. The top plate 1124, which is made from a transparent material, has a pair of viewing holes 1126 formed therein. A suction channel 1060 extends from the top plate 1124 to the bottom plate 1122 for applying suction to an object to be picked up by the device 1010. A prism system 1128 is mounted within the casing 1120 and has a pair of prisms 1130, 1132 on one side of the suction channel 1060 and a pair of prisms 1134, 1136 on an opposite side of the suction channel 1060. The prisms 1130, 1132 have reflective surfaces 1138, 1140, respectively, which are substantially parallel to one another, while the prisms 1134, 1136 have reflective surfaces, 1142, 1144, respectively, which are substantially parallel to one another. The reflective surfaces 1138, 1142 are positioned radially inwardly from the reflective surfaces 1140, 1144, respectively. The reflective surfaces 1138–1144 are oriented at about a 45° angle relative to a longitudinal axis of the device 1010. More particularly, each of the reflective surfaces 1140, 1144 is oriented so as to reflect an image of an object positioned below the nozzle 1058 towards a corresponding one of the reflective surfaces 1138, 1142 (see FIG. 7B) Each of the reflective surfaces 1138, 1142 is aligned with a corresponding one of the viewing holes 1126. The reflective surface 1138 is oriented so as to reflect the image reflected from the reflective surface 1140 to a camera 1082 (see FIG. 5) through a corresponding one of the viewing holes 1126, while the reflective surface 1142 is oriented so as to reflect the image reflected from the reflective surface 1144 to the camera 1082 through a corresponding one of the viewing holes 1126.

With reference to FIGS. 7A and 7B, the device 1010 is adapted for use in connection with a semiconductor component 1102 having fiducial marks 1146, 1148. More particularly, the device 1010 is aligned with the semiconductor component 1102 such that the image of the fiducial mark 1146 is reflected to the reflective surface 1138 from the reflective surface 1140 and then to the camera 1082 from the reflective surface 1138 and such that the image of the fiducial mark 1148 is reflected to the reflective surface 1142 from the reflective surface 1144 and then to the camera 1082 from the reflective surface 1142. In this manner, the prism system 1128 functions to increase or shift the "effective" field of view (as indicated by the arrow B in FIG. 7B) associated with the camera 1082, thereby transmitting the image of an object lying outside of the "actual" field of view (as indicated by the arrow A in FIG. 6B) to the camera 1082. Without the prism system 1128, the fiducial marks, which lie outside the "actual" field of view of the camera 1082, would not come within the camera's view (see FIG. 6A) without decreasing the camera magnification.

Figure 8:
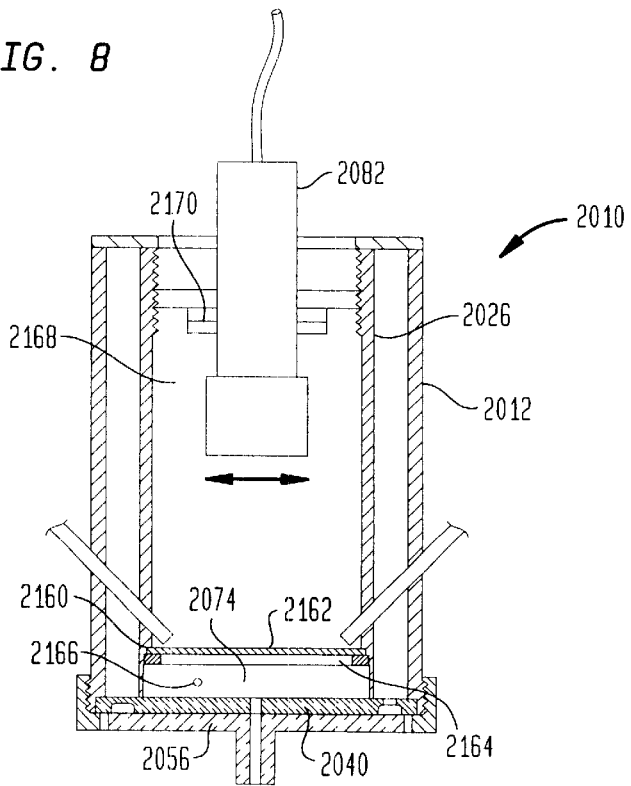
FIG. 8 is a cross-sectional view of a pick-up device constructed in accordance with a third embodiment of the present invention.

FIG. 8 illustrates a pick-up device 2010 constructed in accordance with a third embodiment of the present invention. More particularly, the device 2010 has a housing 2012, a cylinder 2026, a transparent lower disc 2040 and an end plate 2056. The lower disc 2040 is identical to the disc 40 of the embodiment shown in FIGS. 1–4. The cylinder 2026 has an internal shoulder 2160 at a predetermined distance from the lower disc 2040. A transparent upper disc 2162 is positioned in the cylinder 2026 so as to form a suction chamber 2074 between the upper and lower discs 2162, 2040. A retainer ring 2164 is mounted to the cylinder 2026 for retaining the upper disc 2162 against the internal shoulder 2160 of the cylinder 2026 in a fluid-tight manner. For the purpose of providing fluid-tight engagement, a sealing member (not shown) can be provided between the upper disc 2162 and the cylinder 2026. An opening 2166, which is formed in the cylinder 2026, communicates with the suction chamber 2074 for applying suction to the suction chamber 2074.

Still referring to FIG. 8, the device 2010 has a camera 2082 mounted in a space 2168 defined by the cylinder 2026 above the suction chamber 2074. A moving mechanism 2170 is mounted in the cylinder 2026 for moving the camera 2082 in the space 2168. More particularly, because of the moving mechanism 2170, the camera 2082 is adapted to linearly move in the X-axis and Y-axis directions and/or to rotate in the space 2168 for adjusting its position relative to an object located below the device 2010.

Figure 9:
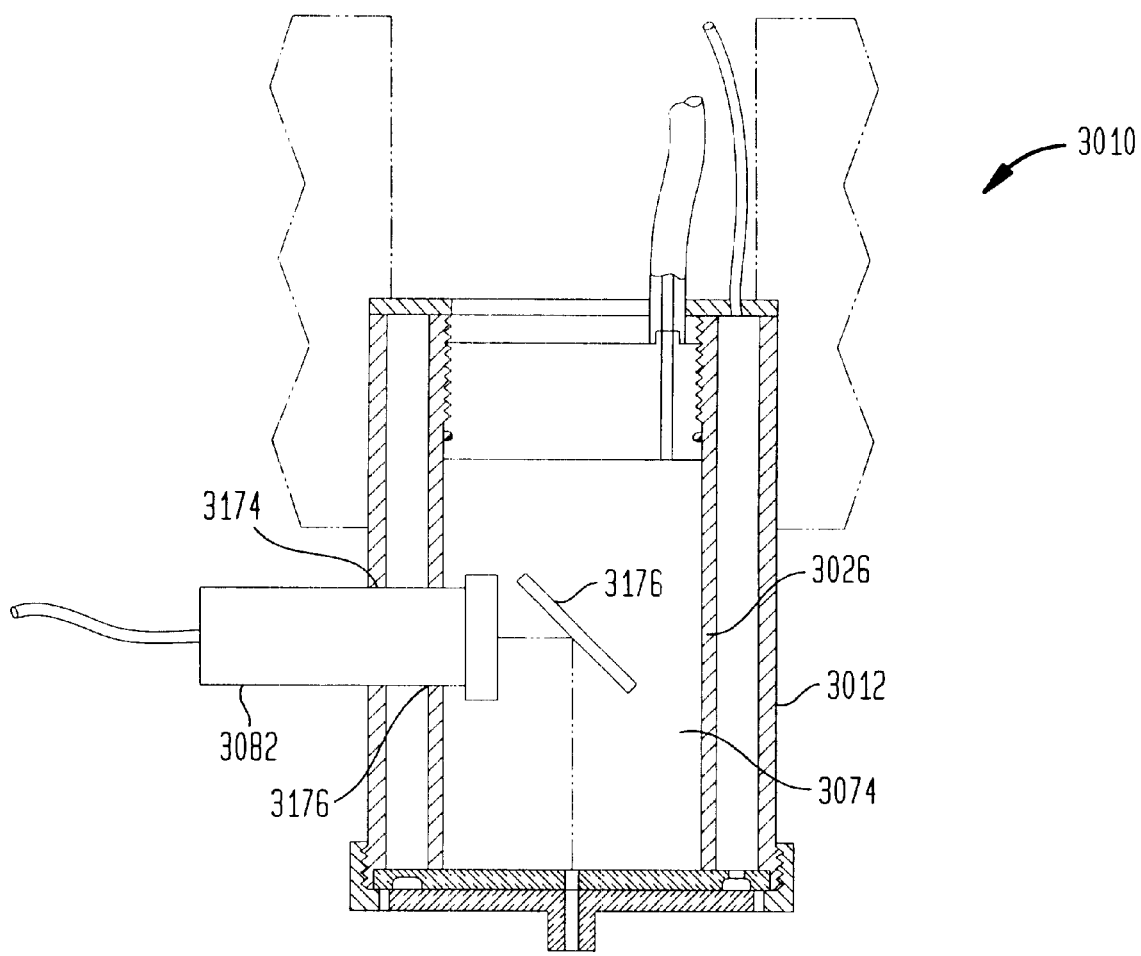
FIG. 9 is a cross-sectional view of a pick-up device constructed in accordance with a fourth embodiment of the present invention.

FIG. 9 shows a pick-up device 3010 constructed in accordance with a fourth embodiment of the present invention. More particularly, the device 3010 has a camera 3082 mounted to the device 3010 in a perpendicular fashion relative to a longitudinal axis of the device 3010. In this regard, the device 3010 has a housing 3012 and a cylinder 3026 having openings 3174, 3176, respectively, for receiving the camera 3082. A mirror 3176 is mounted in a suction chamber 3074 within the cylinder 3026 for reflecting an image of an object positioned below the device 3010 to the camera 3082.

Figure 10:
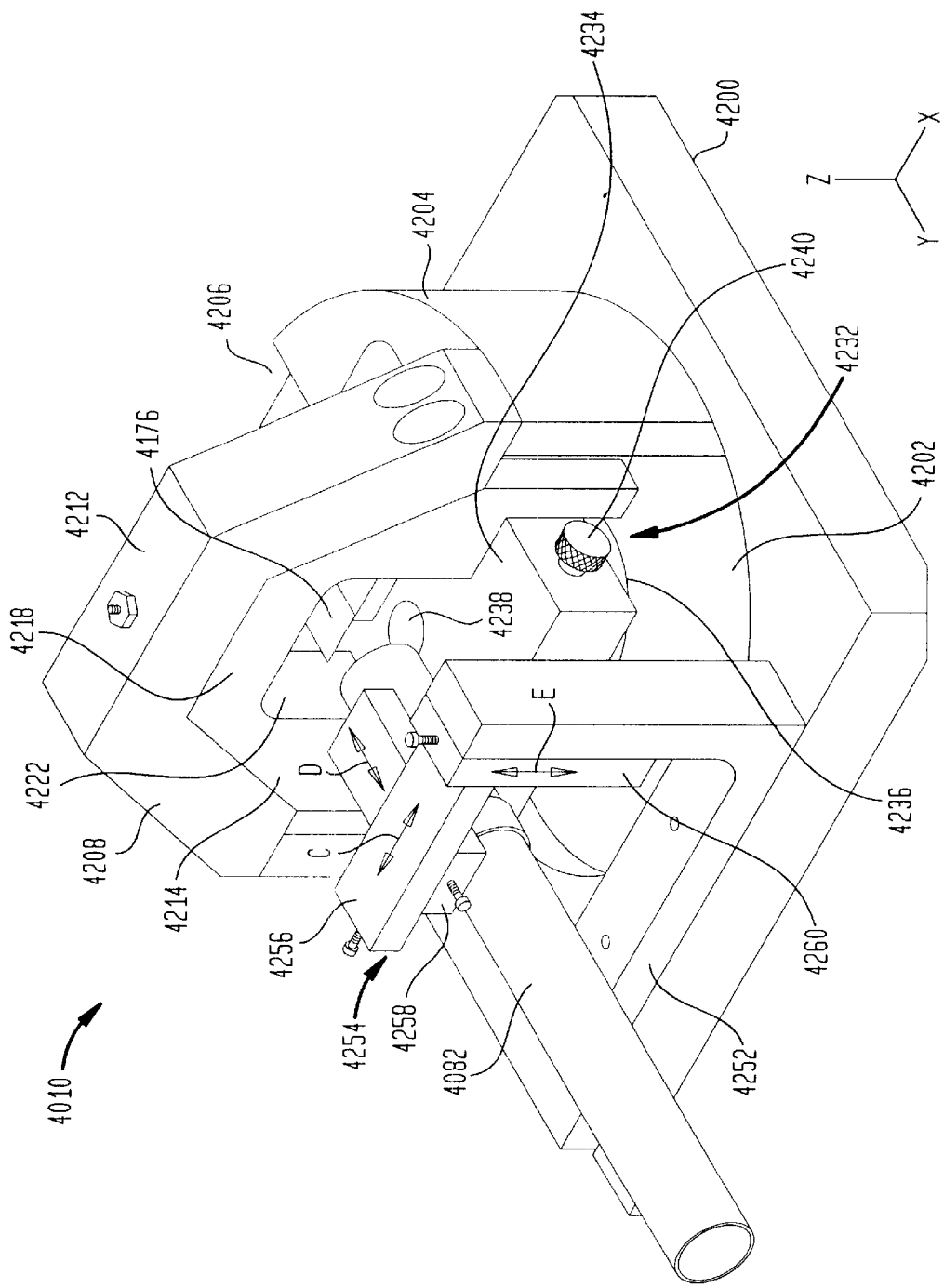
FIG. 10 is a front perspective view of a mounting device constructed in accordance with a fifth embodiment of the present invention.
Figure 11:
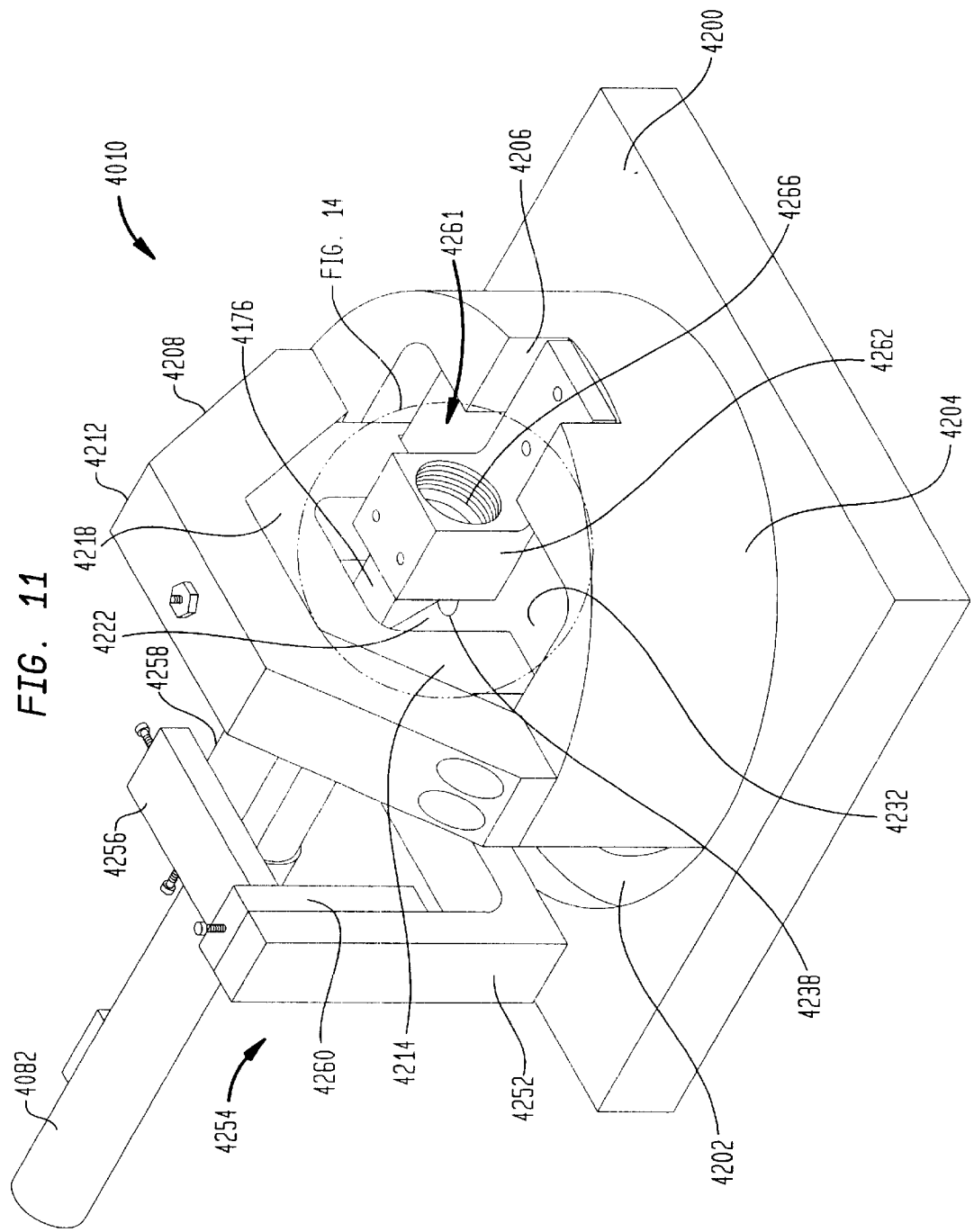
FIG. 11 is a rear perspective view of the device shown in FIG. 10.

FIGS. 10–20B illustrate a mounting device 4010 constructed in accordance with a fifth embodiment of the present invention for mounting a semiconductor component to a substrate. Referring specifically to FIGS. 10 and 11, the mounting device 4010, which has an X-axis, a Y-axis and a Z-axis (as indicated in FIG. 10), includes a mounting head having a base 4200, which has an opening 4202 therethrough, and a riser housing 4204, which has a half-cylindrical shape. The riser housing 4204 is affixed to the base 4200 and is provided with a slot 4206 at one end thereof. A crossbar 4208 extends upwardly from the riser housing 4204, while a hole 4210 (see FIGS. 12 and 15) extends through an upper end 4212 of the crossbar 4208. Below the crossbar 4208, an inner housing 4214 is movably mounted to the riser housing 4204. Crossed roller bearings 4216 (see FIG. 12) are provided between the riser housing 4204 and the inner housing 4214 so as to permit limited movement of the inner housing 4214 relative to the riser housing 4204 in a direction substantially parallel to the Z-axis of the mounting device 4010 for purposes to be discussed hereinafter. The inner housing 4214 has an upper end 4218, which includes a cavity 4220 (see FIGS. 12 and 15) therein, and a space 4222 which is formed below the upper end 4218 of the inner housing 4214.

Figure 12:
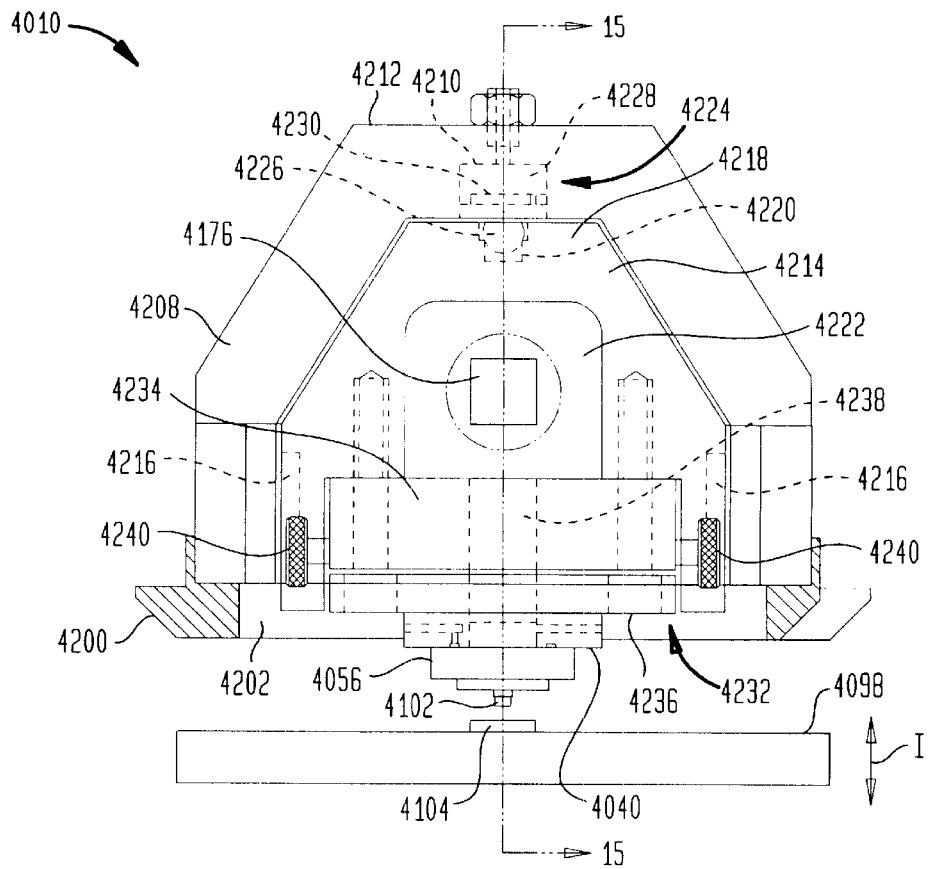
FIG. 12 is a front elevational view of the device shown in FIGS. 10 and 11.
Figure 15:
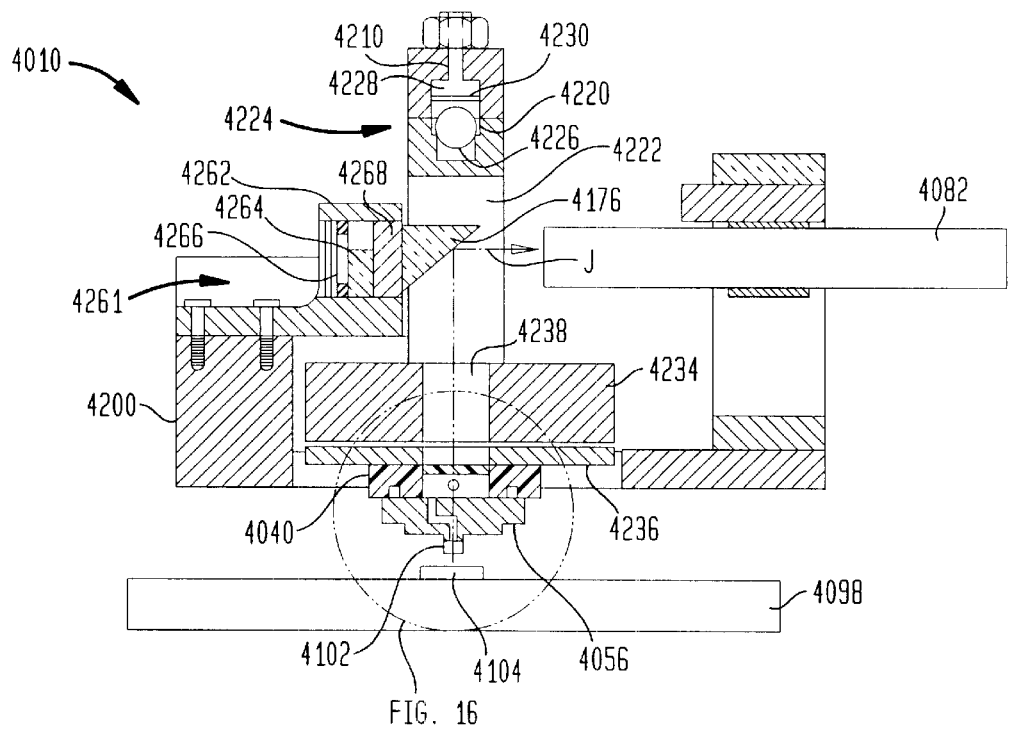
FIG. 15 is a cross-sectional view, taken along section line 15—15 and looking in the direction of the arrows, of the device shown in FIG. 12.
Figure 13:
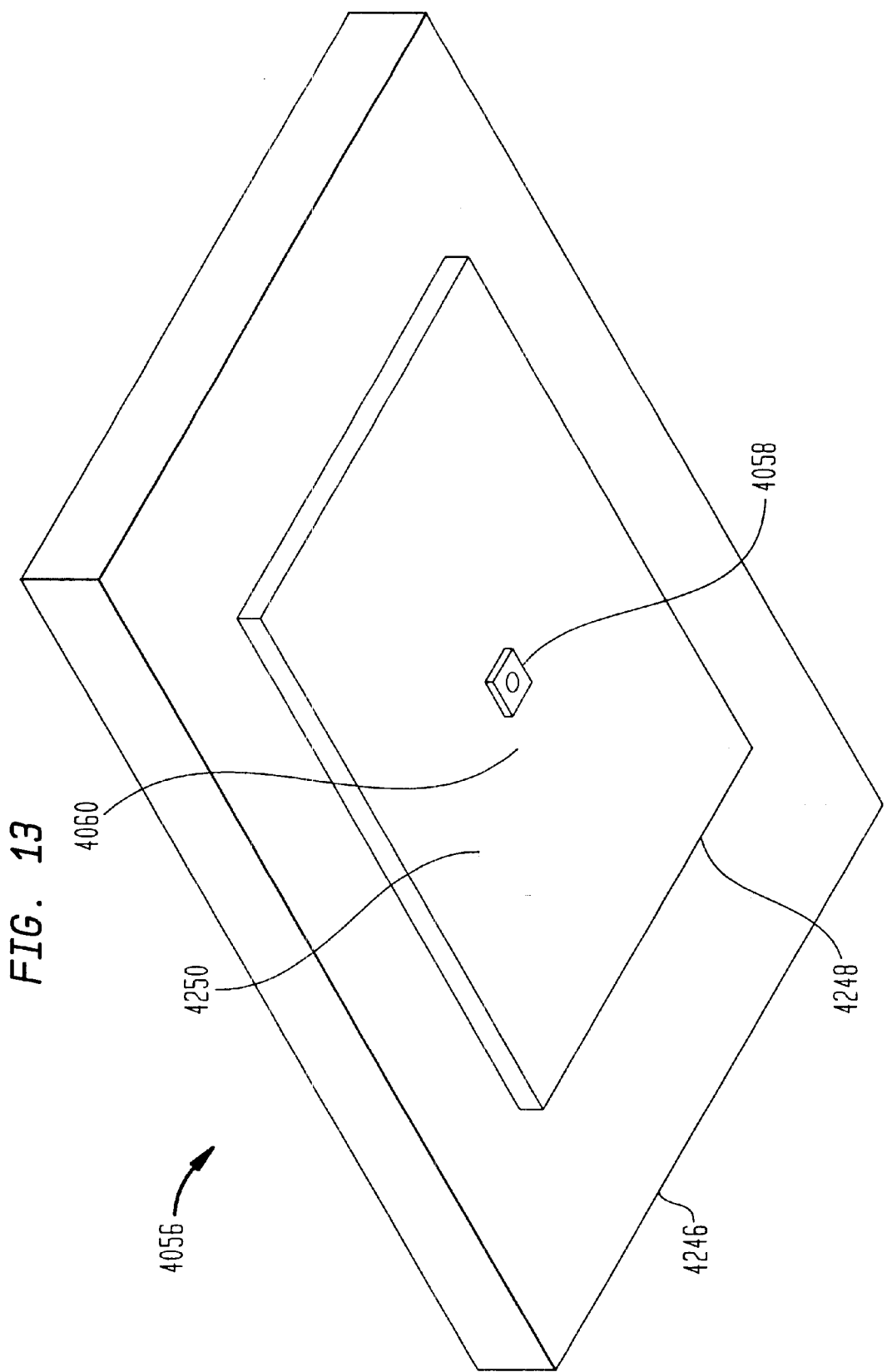
FIG. 13 is a perspective view of a replaceable chuck of the device shown in FIGS. 10–12.
Figure 14:
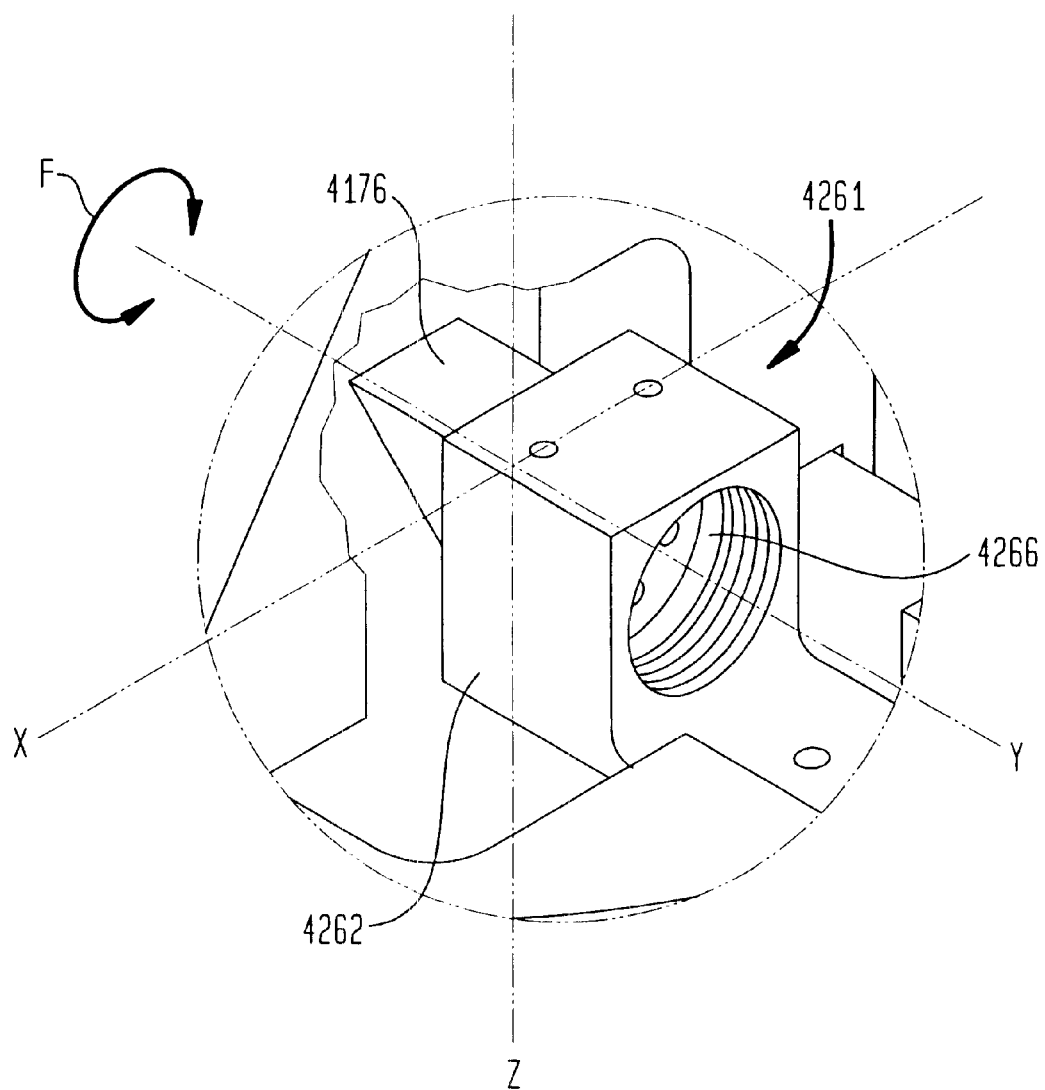
FIG. 14 is an enlarged view of the portion indicated in FIG. 11.

Referring now to FIGS. 12 and 15, a force/load gauge mechanism 4224 is housed in the crossbar 4208 and the inner housing 4214. More particularly, the force/load gauge mechanism 4224 has a ball 4226, which is mounted in the cavity 4220 of the inner housing 4214, a transducer 4228, which is mounted in the hole 4210 of the crossbar 4208, and a force distribution plate 4230, which is positioned between the transducer 4228 and the ball 4226 for evenly distributing to the transducer 4228 upwardly directed vertical force applied by the ball 4226.

With reference to FIGS. 10, 12 and 15, a rotary stage 4232 is positioned below the inner housing 4214. More particularly, the rotary stage 4232, which is similar, in construction, to the rotary stage marketed by Parker Daedal Division as model no. 2535, has a mounting plate 4234 and a rotary plate 4236 rotatably connected to the mounting plate 4234. The mounting plate 4234 is removably attached to the inner housing 4214 via a pair of bolts. A vertical opening 4238 extends completely through the mounting plate 4234 and the rotary plate 4236 for purposes to be discussed hereinafter. Locking/adjustment knobs 4240 are provided for adjusting the angular orientation of the rotary plate 4236 relative to the mounting plate 4234 and for locking the rotary plate 4236 to the mounting plate 4234 in its adjusted angular orientation.

Figure 16:
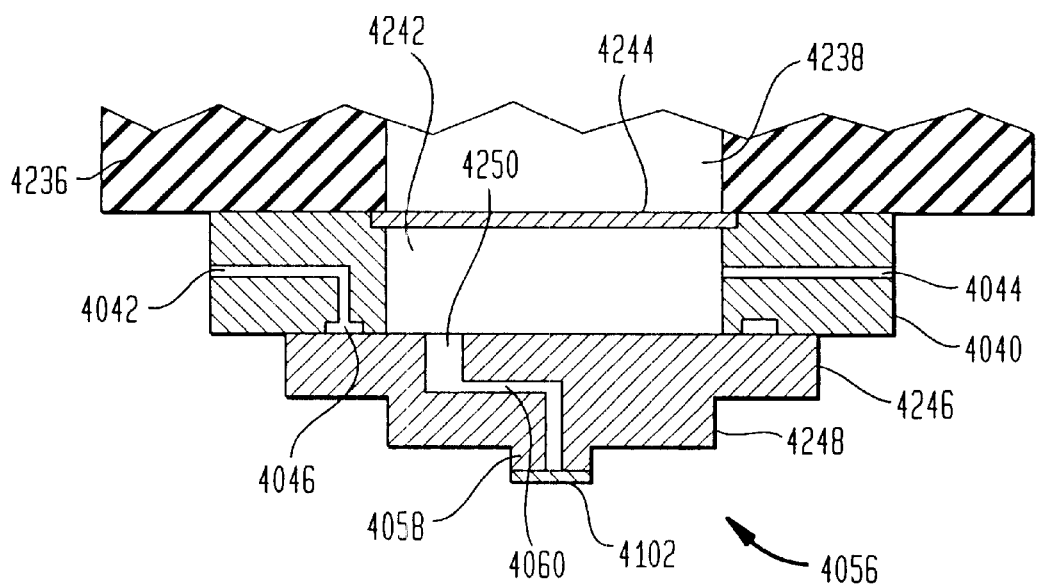
FIG. 16 is an enlarged view of the portion indicated in FIG. 15.
Figure 17:
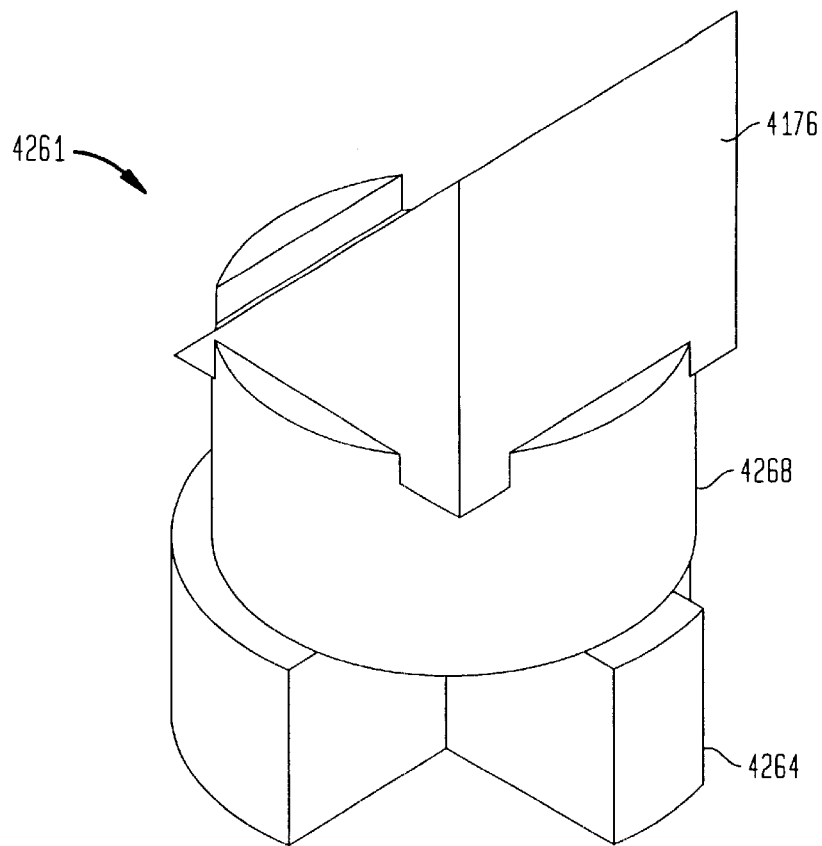
FIG. 17 is a perspective view of a portion of a mirror assembly used in the device shown in FIGS. 10–12 and 15.
Figure 18:
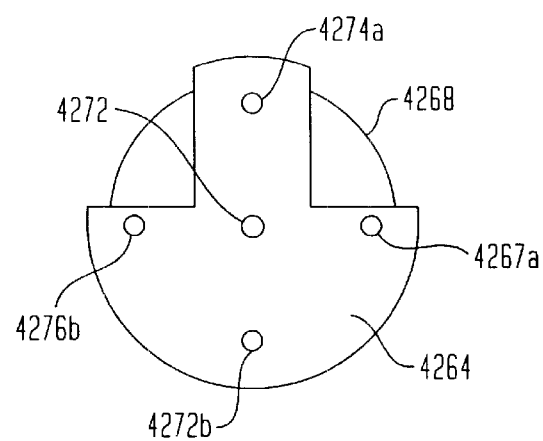
FIG. 18 is a rear elevational view of the mirror assembly shown in FIG. 17.
Figure 19A:
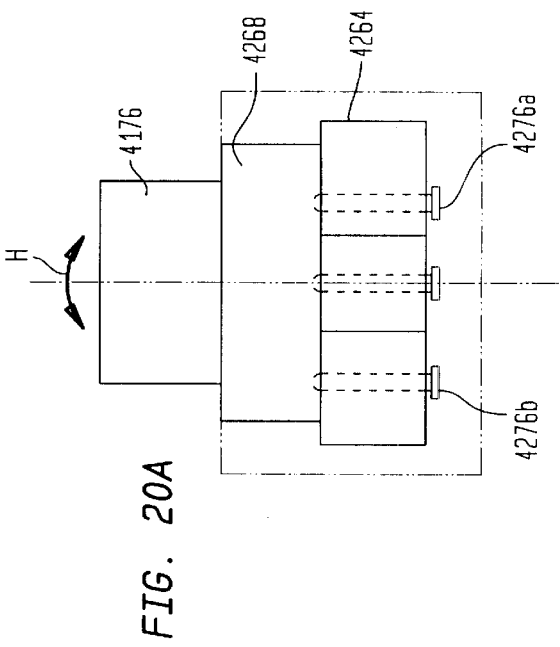
FIGS. 19A–20B are schematic views of the mirror assembly shown in FIG. 16, illustrating adjustment to the orientation of the mirror assembly.
Figure 20A:
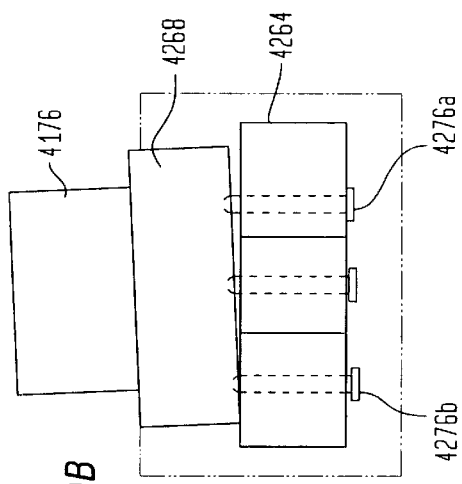
Figure 19B:
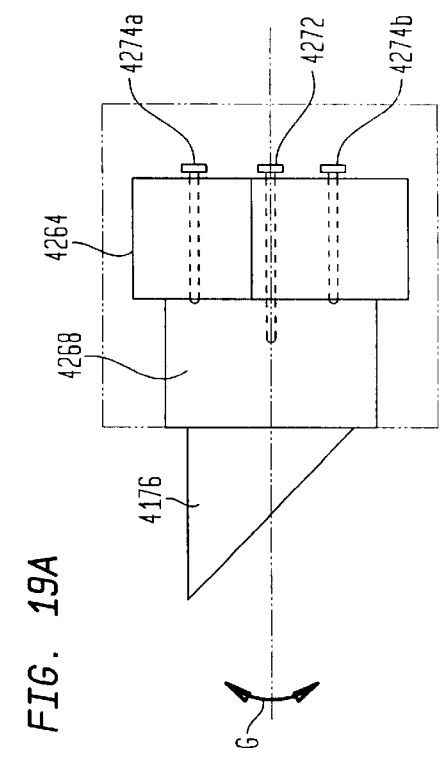
Figure 20B:
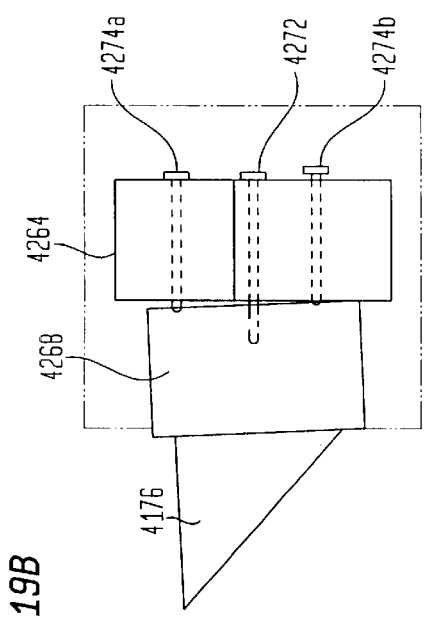

Now referring to FIGS. 12, 15 and 16, a vacuum transfer plate 4040 is located below the rotary stage 4232. More particularly, the vacuum transfer plate 4040 is mounted to the rotary plate 4236 via a plurality of bolts (not shown). The vacuum transfer plate 4040, which is made from an opaque material, such as aluminum, has an orifice 4242 extending completely through the vacuum transfer plate 4040. A transparent sealing plate 4244 is mounted in an upper end of the orifice 4242 for closing off same in a fluid-tight manner, while a suction channel 4044 extends through the vacuum transfer plate 4040 and communicates with the orifice 4242 for applying suction to the orifice 4242. An open circular groove 4046 is also formed in a lower surface of the vacuum transfer plate 4040 located opposite the rotary plate 4236. A suction channel 4042 extends through the vacuum transfer plate 4040, communicating with the groove 4046. The vacuum transfer plate 4040 is mounted to the rotary plate 4236 in such a manner that the orifice 4242 is substantially aligned with the opening 4238 of the rotary stage 4232.

With reference to FIGS. 12, 13, 15 and 16, the mounting device 4010 also includes a removable and replaceable transparent (i.e., see-through) upper chuck 4056. More particularly, the upper chuck 4056, which is adapted to be removably attached to the vacuum transfer plate 4040, includes a base portion 4246, an intermediate portion 4248, which depends from the base portion 4246, and an engagement nozzle 4058 which depends from the intermediate portion 4248. The engagement nozzle 4058 is sized and shaped so as to engage a semiconductor component. A suction channel 4060 extends through the base portion 4246, the intermediate portion 4248 and the engagement nozzle 4058. An opening 4250 is formed in the base portion 4246, communicating with the suction channel 4060.

Referring to FIGS. 10 and 11, a camera assembly 4082, which is equipped with a camera, a lens and an illumination mechanism, is mounted on the base 4200 opposite the riser housing 4204. More particularly, the camera assembly 4082, which is similar, in construction, to the combination of the devices marketed by MORITEX, INC., San Diego, Calif., as part nos. MML4-65D-CS1 and CVM-1000, is mounted to the base 4200 by an L-shaped bracket 4252 and a slide assembly 4254. More particularly, the slide assembly 4254 includes X-axis, Y-axis and Z-axis slides 4256, 4258, 4260 mounted to the bracket 4252 for manually adjusting the position of the camera assembly 4082 in directions substantially parallel to the X-axis, Y-axis and Z-axis, respectively, of the mounting device 4010 (as indicated by arrows C, D and E, respectively, in FIG. 10).

Referring now to FIGS. 11, 14, 15, 17 and 18, a mirror assembly 4261 is mounted from the riser housing 4204. More particularly, the mirror assembly 4261 has a mirror housing 4262 removably attached to the slot 4206 of the riser housing 4204. A mounting block 4264 is positioned in the mirror housing 4262, while a retainer 4266 (see FIG. 15) is threaded to the mirror housing 4262 for securing the mounting block 4264 to the mirror housing 4262. A mount 4268 is positioned in the mirror housing 4262, while a mirror 4176 extends from the mount 4268 into the space 4222 defined by the inner housing 4214 for purposes to be discussed hereinafter. A connecting screw 4272 (see FIGS. 18 and 19A) secures the mount 4268 and hence the mirror 4176 to the mounting block 4264. When loosened, the connecting screw 4272 allows the mount 4268 and hence the mirror 4176 to rotate relative to the mounting block 4264, thereby permitting adjustment to the angular orientation of the mirror 4176 about an axis parallel to the Y-axis of the mounting device 4010 (as indicated by arrow F in FIG. 14). When tightened, the connecting screw 4272 locks the mount 4268 to the mounting block 4264 for maintaining the angular orientation of the mirror 4176. The mirror assembly 4261 also has a pair of adjustment screws 4274a, 4274b and a pair of adjustment screws 4276a, 4276b, all of which extend through the mounting block 4264. The adjustment screws 4274a, 4274b are adapted for use in adjusting the orientation of the mirror 4176 about an axis parallel to the X-axis of the mounting device 4010 (as indicated by arrow G in FIG. 19A). For instance, by threading the adjustment screw 4274a further into the mounting block 4264, the mount 4268, together with the mirror 4176, pivots about an axis parallel to the X-axis and thereby yaws towards the bottom side of the mounting device 4010 (see FIG. 19B). Likewise, the adjustment screws 4276a, 4276b are adapted for use in adjusting the orientation of the mirror 4176 about an axis parallel to the Z-axis of the mounting device 4010 as indicated by arrow H in FIG. 20A. For instance, by threading the adjustment screw 4276a further into the mounting block 4264, the mount 4268 pivots about an axis parallel to the Z-axis and thereby yaws towards the left side of the mounting device 4010 (see FIG. 19B). By using the connecting screw 4272 and the adjustment screws 4274a, 4274b, 4276a, 4276b, the mirror 4176 can be properly aligned with the opening 4238 of the rotary stage 4232 and the camera assembly 4082.

With reference to FIGS. 12 and 15, a lower chuck 4098 is positioned below the mounting device 4010 and is sized and shaped so as to support a substrate 4104 thereon. The lower chuck 4098 is vertically movable relative to the mounting device 4010 (as indicated by arrow I in FIG. 12).

The mounting device 4010 is adapted for use in connection with any bonding machines, such as die bonding apparatus and flip chip bonding machines. When used in combination with a flip chip bonding machine, after pivoting the mounting device 4010 from a closed position to an open position, the upper chuck 4056 is attached to the vacuum transfer plate 4040 via suction applied thereto from a suction source (not shown) through the suction channel 4042 and the groove 4046 (see FIG. 16). The opening 4250 of the upper chuck 4056 is also aligned with the orifice 4242 of the vacuum transfer plate 4040 such that a semiconductor component or a die 4102, which is manually placed on the engagement nozzle 4058 by a conventional method, can be gripped by the upper chuck 4056. That is, suction is applied to the semiconductor component 4102 from an independent suction source (not shown) through the suction channel 4044 of the vacuum transfer plate 4040 and through the suction channel 4060 of the upper chuck 4056 (see FIG. 16). After the semiconductor component 4102 is properly gripped by the upper chuck 4056, the angular orientation of the semiconductor component 4102 is pre-adjusted adjusting the angular orientation of the rotary plate 4236 with the use of the locking/adjustment knobs 4240. Alternatively, the angular orientation of the rotary plate 4236 can be adjusted during alignment of the substrate 4104 with the semiconductor component 4102.

After the mounting device 4010 is pivoted back to its closed position from its open position, the lower chuck 4098 is moved to a predetermined position adjacent the mounting device 4010. Because the upper chuck 4056 and the sealing plate 4244 are transparent, the semiconductor component 4102 and the substrate 4104, including their fiducial or aligning marks, can be simultaneously viewed by the camera assembly 4082. That is, the images of the semiconductor component 4102 and the substrate 4104 are reflected to the camera assembly 4082 by the mirror 4207 (as indicated by arrow J in FIG. 15). In this regard, the opening 4238 of the rotary stage 4232 and the orifice 4242 of the vacuum transfer plate 4040 function as a viewing hole. If any portions of the semiconductor component 4102 and/or the substrate 4104, including their fiducial marks, fall outside the field of view of the camera, the slide assembly 4254 can be used to adjust the position of the camera assembly 4082 for the purpose of bring such portions into the field of view of the camera. Moreover, in applications requiring a high powered magnification, the camera assembly 4082 can be located at multiple positions during alignment of the substrate 4104 with the semiconductor component 4102 for the purpose of providing the camera with multiple fields of view.

After properly adjusting the X-axis, Y-axis and θ orientations of the substrate 4104 relative to the semiconductor component 4102 with the use of the images fed to the camera assembly 4082, the lower chuck 4098 is moved upwardly so as to mount the semiconductor component 4102 on the substrate 4104. An upward force applied to the semiconductor component 4102 by the lower chuck 4098 displaces the inner housing 4214 upwardly. As a result, the ball 4226 of the force/load gauge mechanism 4224 engages the force distribution plate 4230, which, in turn, transfers the applied force to the transducer 4228, for the purpose of measuring the extent of the force applied by the lower chuck 4098 to the mounting device 4010. The force/load gauge mechanism 4224 then provides a feedback to an operator or a controller.

After properly mounting or placing the semiconductor component 4102 on the substrate 4104, the mounting device 4010 terminates the suction applied to the semiconductor component 4102 and thus releases the semiconductor component 4102. The lower chuck 4098 then moves downwardly to a position remote from the mounting device 4010.

It should be noted that the mounting device 4010 illustrated in FIGS. 10–20B can have numerous modifications, variations and applications. For instance, the mounting device 4010 can be used in combination with other types of bonding machines. Moreover, the position of the camera assembly 4082 can be adjusted automatically.

Figure 21:
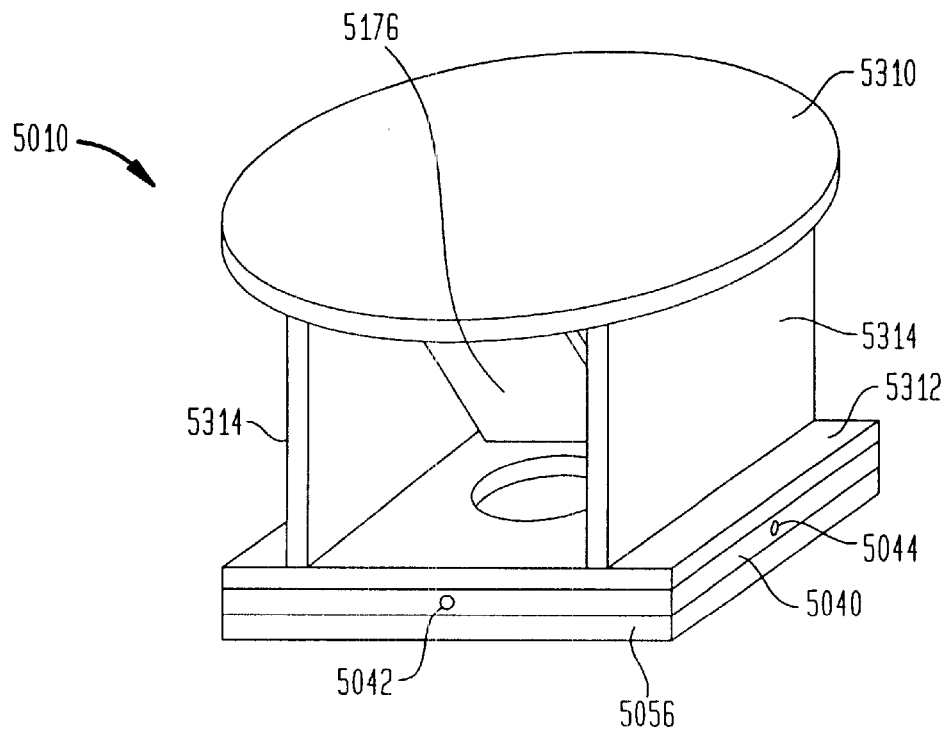
FIG. 21 is a perspective view of a pick-up device constructed in accordance with a sixth embodiment of the present invention.
Figure 22:
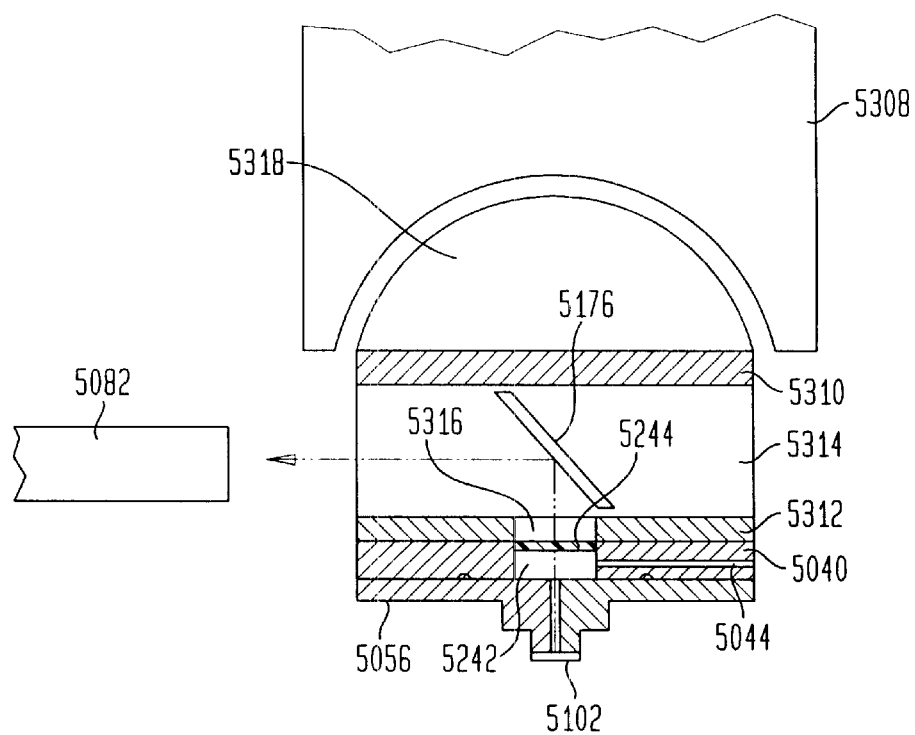
FIG. 22 is a schematic view of the device shown in FIG. 21, illustration the operation of the device.

FIGS. 21 and 22 show a pick-up device 5010 constructed in accordance with a sixth embodiment of the present invention for use in combination with a pitch and roll mechanism 5308. More particularly, the pick-up device 5010 includes an upper plate 5310, which has a circular shape, a lower plate 5312, and a pair of vertical plates 5314 connecting the upper plate 5310 to the lower plate 5312 in a spaced manner. The lower plate 4312 has an opening 5316 therethrough. A vacuum transfer plate 5040, which has a construction similar to the vacuum plate 4040 of the embodiment illustrated in FIGS. 10–20B, is attached to the lower plate 5312. The vacuum transfer plate 5040 has a pair of suction channels 5042, 5044, which are similar, in construction and function, to the suction channels 4042, 4044, respectively, of the embodiment of FIGS. 10–20B, an orifice 5242, which extends completely through the vacuum transfer plate 5040, and a transparent seal plate 5244 for closing off an upper end of the orifice 5242 in a fluid-tight manner. The pick-up device 5010 also includes a transparent chuck 5056, which is similar, in construction, to the upper chuck 4056 of the embodiment illustrated in FIGS. 10–20B and which is therefore sized and shaped so as to be removably attached to the vacuum transfer plate 5040. A mirror 5176 is mounted between the upper and lower plates 5310, 5312 such that a semiconductor component 5102 picked up by the chuck 5056 can be viewed by a camera assembly 5082. The pick-up device 5010 also has a semi-spherical mounting member 5318 for engagement with a bonding head of the pitch and roll mechanism 5308.

Figure 23:
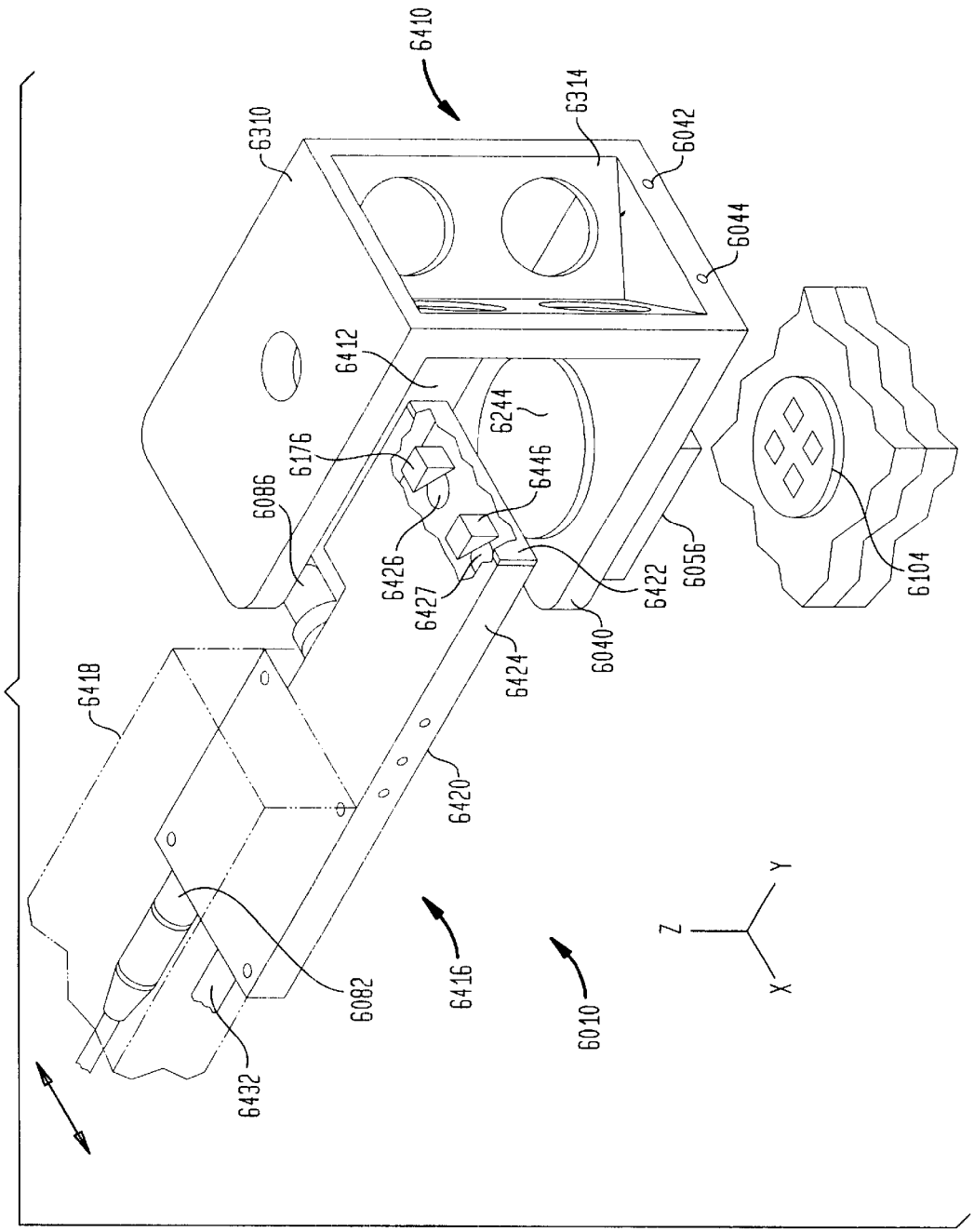
FIG. 23 is a perspective view of a mounting device constructed in accordance with a seventh embodiment of the present invention.

FIGS. 23–26 illustrate a mounting device 6010 constructed in accordance with a seventh embodiment of the present invention. Referring to FIGS. 23 and 26, the mounting device 6010 includes a mounting bracket 6410 attached to an end of a bond head (not shown in FIGS. 23–26) of an associated mounting apparatus such that the mounting bracket 6410 is movable in directions parallel to X, Y and/or Z axes of the mounting apparatus. The mounting bracket 6410 includes an upper horizontal plate 6310, a lower horizontal plate 6040 and a vertical plate 6314. The upper and lower horizontal plates 6310, 6040 extend from the vertical plate 6314 so as to define a viewing area 6412 therebetween. The lower horizontal plate 6040 includes an orifice 6242 extending vertically therethrough. A transparent sealing plate 6244 is mounted to an upper surface of the lower horizontal plate 6040 so as to close off an upper end of the orifice 6242 in a fluid-tight manner. The lower horizontal plate 6040 also includes an open groove 6046 formed in a lower side of the lower horizontal plate 6040. Suction channels 6042, 6044 are provided in the lower horizontal plate 6040 of the mounting bracket 6410 for providing suction to the open groove 6046 and the orifice 6242, respectively.

Still referring to FIGS. 23 and 26, a transparent chuck 6056 is removably attached to the lower horizontal plate 6040 by application of suction to the open groove 6046 through the suction channel 6042. The transparent chuck 6056 includes a nozzle 6058 and a channel 6060 extending through the nozzle 6058 for gripping a semiconductor component 6102 in a manner similar to the manner described in connection with the embodiments of FIGS. 1–22.

Unlike the embodiments of FIGS. 1–22, the mounting device 6010 includes a fail-safe mechanism for retaining or holding the transparent chuck 6056 in place even if suction to the open groove 6046 is, inadvertently or otherwise, discontinued. More particularly, retaining screws 6414 are fastened to the lower horizontal plate 6040 and engage portions of the transparent chuck 6056 so as to secure same to the lower horizontal plate 6040. In this manner, the transparent chuck 6056 is held in place regardless of whether suction is applied to the open groove 6046. Alternatively, the screws 6414 can be omitted or replaced with other fail-safe mechanisms (e.g., clips, fasteners, etc.).

Figure 24:
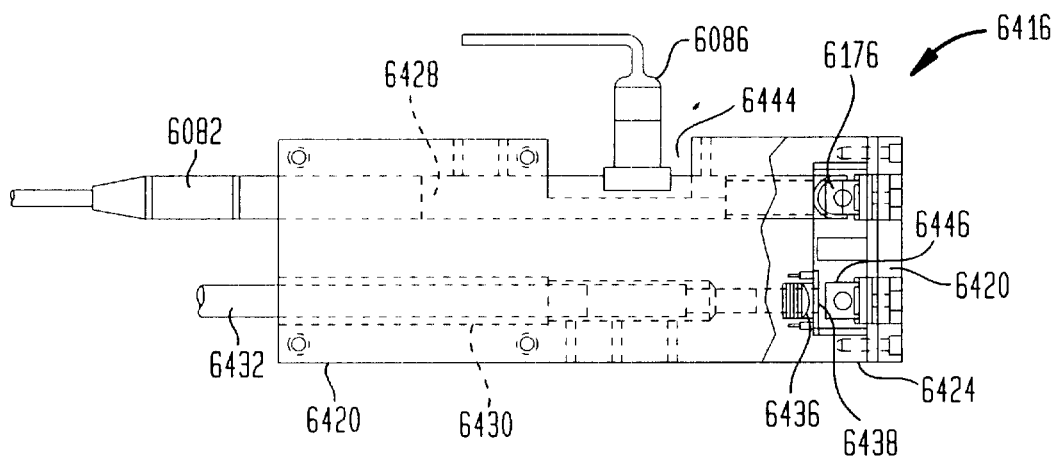
FIG. 24 is a top plan view of an optical probe assembly of the device shown in FIG. 23.
Figure 25:
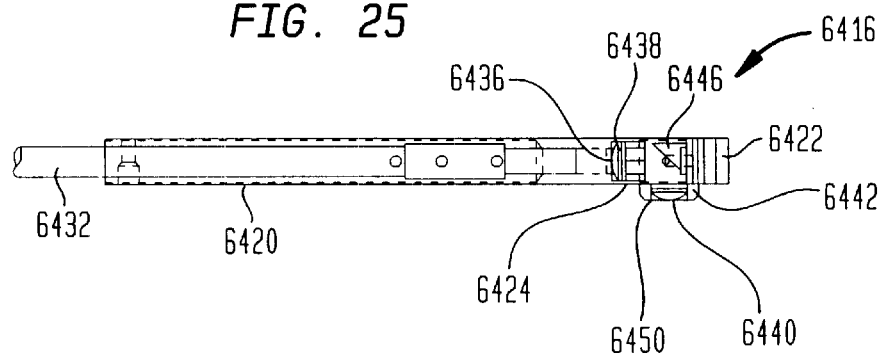
FIG. 25 is a side view of the optical probe assembly shown in FIG. 24.

With reference to FIGS. 23–25, the mounting device 6010 includes an optical probe assembly 6416 mounted to a moving mechanism 6418 of the mounting apparatus. More particularly, the moving mechanism 6418 is movable in directions parallel to the X, Y and/or Z axes of the mounting apparatus for independently and selectively moving the optical probe assembly 6416 relative to the mounting bracket 6410 and hence the transparent chuck 6056. The optical probe assembly 6416 includes a housing 6420 and a nose 6422 removably attached to a probing end 6424 of the housing 6420. Holes 6426, 6427 are provided in the probing end 6424 of the housing 6420. The housing 6420 also has a pair of passages 6428, 6430 extending therethrough along a direction substantially parallel to a longitudinal axis of the housing 6420 (i.e., parallel to the Y axis). A camera 6082 is mounted in the passage 6428, while a U.V. light source 6432 is mounted in the passage 6430. A lens 6436 is also mounted in the passage 6430 by a lens mount 6438, while a lens 6440 is mounted in a lens support 6442 located at the probing end 6424 of the housing 6420 below the hole 6427. Moreover, a slot 6444 cuts into the passage 6428 for receiving an illumination device 6086 so as to provide illumination to the transparent chuck 6056 during a mounting process.

Still referring to FIGS. 23–25, the nose 6422 includes a pair of mirrors 6176, 6446 affixed thereto. More particularly, when the nose 6422 is properly mounted to the probing end 6424 of the housing 6420, the mirrors 6176, 6446 are positioned in the probing end 6424 and are aligned with the passages 6428, 6430, respectively, of the housing 6420. That is, the mirrors 6176, 6446 are aligned with the camera 6082 and the U.V. light source 6432, respectively, along a direction substantially parallel to the longitudinal axis of the housing 6420. The mirrors 6176, 6446 are also aligned with the holes 6426, 6427 of the housing 6420 in a direction substantially parallel to a vertical axis of the housing 6420 (i.e., parallel to the Z axis). The mirror 6176 has an angled reflective surface 6448 (see FIG. 26) such that an image of the semiconductor component 6102 picked up by the transparent chuck 6056 can be transmitted to the camera 6082 through the hole 6426. Likewise, the mirror 6446 has an angled reflective surface 6450 such that a U.V. light generated from the U.V. light source 6432 can be transmitted vertically downwardly towards the semiconductor component 6102 so as to cure an adhesive substance applied to the semiconductor component 6102.

In operation, after mounting the transparent chuck 6056 to the mounting bracket 6410, the semiconductor component 6102 is picked up by the transparent chuck 6056 by application of suction to the orifice 6242 through the suction channel 6044. After the mounting bracket 6410 is positioned above a substrate 6104, the probing end 6424 of the optical probe assembly 6416 moves into the viewing area 6412 of the mounting bracket 6410 such that the mirror 6176 is vertically aligned with the semiconductor component 6102. In this manner, the orientation and position of the semiconductor component 6102 can be viewed by the camera 6082. After the semiconductor component 6102 is properly positioned and oriented relative to the substrate 6104, the optical probe assembly 6416 moves out of the viewing area 6412 of the mounting bracket 6410. The mounting bracket 6410 then moves downwardly towards the substrate 6104 and places the semiconductor component 6102 on the substrate 6104. After the mounting bracket 6410 moves away from the substrate 6104, the probing end 6424 of the optical probe assembly 6416 moves to a location such that the mounted semiconductor component 6102 is vertically aligned with the lens 6440 and the mirror 6446. A U.V. light is transmitted from the U.V. light source 6432 towards the mirror 6446 through the lens 6436 and is then reflected towards the semiconductor component 6102 by the mirror 6446 for curing an adhesive substance applied to the semiconductor component 6102 and/or the substrate 6104.

It should be noted that the mounting device 6010 provides additional advantages over the prior art discussed above. For instance, the mounting device 6010 is adapted for use in connection with conventional mounting apparatus without substantial modifications to such mounting apparatus. In other words, conventional mounting apparatus can be readily retrofitted with the mounting device 6010.

It will be understood that the embodiments described herein are merely exemplary and that a person skilled in the art may make many variations and modifications without departing from the spirit and scope of the invention. All such variations and modifications are intended to be included within the scope of the invention as defined in the appended claims.

We claim:

1. Apparatus adapted for gripping an object, comprising a mounting head; suction-operated gripping means for selectively gripping an object positioned adjacent one side of said gripping means; suction-operated attaching means for selectively and removably attaching said gripping means to said mounting head, whereby said gripping means is removable from said mounting head and is hence replaceable; and viewing means, including a camera, for viewing an object gripped by said gripping means, said viewing means being located on an opposite side of said gripping means, said gripping means having a light-transmitting portion positioned in such a manner that an object gripped by said gripping means can be viewed by said camera through said gripping means, and said camera being independently and selectively movable relative to said mounting head.

2. The apparatus of claim 1, further comprising first supplying means for selectively and independently supplying suction to said attaching means and second supplying means for selectively and independently supplying suction to said gripping means.

3. The apparatus of claim 2, wherein said attaching means includes a vacuum transfer plate mounted to said mounting head, said vacuum transfer plate including a groove having a side open towards said gripping means such that suction can be applied from said first supplying means to said gripping means through said groove.

4. The apparatus of claim 3, wherein said vacuum transfer plate includes a first suction channel formed through said vacuum transfer plate and communicating with said groove, said first suction channel being connected to said first supplying means.

5. The apparatus of claim 4, wherein said light-transmitting portion is positioned in the field of view of said camera.

6. The apparatus of claim 5, wherein said gripping means includes a chuck having a second suction channel through said light-transmitting portion for gripping an object in response to application of suction from said second supplying means through said second suction channel.

7. The apparatus of claim 6, wherein said second supplying means includes a third suction channel extending through said vacuum transfer plate, said third suction channel communicating with said second channel for supplying suction to said second suction channel through said third suction channel.

8. The apparatus of claim 7, wherein said viewing means includes a mirror for reflecting the image of an object gripped by said gripping means to said camera, said mirror being movable conjointly with said camera relative to said mounting head.

9. The apparatus of claim 8, wherein said viewing means includes a housing for housing said camera and said mirror.

10. The apparatus of claim 1, wherein said viewing means includes a mirror for reflecting the image of an object gripped by said gripping means to said camera, said mirror being movable conjointly with said camera relative to said mounting head.

11. The apparatus of claim 10, wherein said viewing means includes a housing for housing said camera and said mirror.

* * * * *